US012751103B2

(12) United States Patent
Kim et al.

(10) Patent No.: US 12,751,103 B2
(45) Date of Patent: Sep. 29, 2026

(54) IMAGE SENSORS HAVING HIGH DENSITY SUBPIXELS THEREIN WITH ENHANCED PIXEL SEPARATION STRUCTURES

(71) Applicant: Samsung Electronics Co., Ltd., Suwon-si (KR)

(72) Inventors: Wonhyeok Kim, Suwon-si (KR); Seungjoo Nah, Suwon-si (KR); Heegeun Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 366 days.

(21) Appl. No.: 18/517,562

(22) Filed: Nov. 22, 2023

(65) Prior Publication Data

US 2024/0290808 A1 Aug. 29, 2024

(30) Foreign Application Priority Data

Feb. 23, 2023 (KR) ........................ 10-2023-0024590

(51) Int. Cl.
*H10F 39/00* (2025.01)
*H10F 39/12* (2025.01)

(52) U.S. Cl.
CPC ......... *H10F 39/807* (2025.01); *H10F 39/024* (2025.01); *H10F 39/199* (2025.01); *H10F 39/813* (2025.01)

(58) Field of Classification Search
None
See application file for complete search history.

(56) References Cited

U.S. PATENT DOCUMENTS 10,014,338 B2 7/2018 Lee
10,249,666 B2 4/2019 Pyo et al.
2021/0343765 A1 11/2021 Gu
2022/0123033 A1 4/2022 Park et al.
2022/0199660 A1* 6/2022 Lee ....................... H10F 39/802
(Continued)

FOREIGN PATENT DOCUMENTS

KR 100761824 B1 9/2007
KR 20210133739 A 11/2021
(Continued)

*Primary Examiner* — Daniel Whalen
(74) *Attorney, Agent, or Firm* — Wolf, Greenfield & Sacks, P.C.

(57) ABSTRACT

An image sensor is provided, and the image sensor includes: a substrate having first and second surfaces spaced apart from each other in a vertical direction; a first color unit pixel including a first subpixel to a fourth subpixel arranged in a 2×2 matrix; a second color unit pixel including four subpixels arranged in a 2×2 matrix; a first pixel isolation trench separating the first color unit pixel and the second color unit pixel; a second pixel isolation trench separating the first subpixel and the second subpixel of the first color unit pixel; a third pixel isolation trench on a point of intersection of the first to fourth subpixels of the first color unit pixel. The first color unit pixel detects first color light. The second color unit pixel detects second color light. The image sensor is configured to receive the first color light on the second surface. The second pixel isolation trench extends from the first surface to the second surface. The third pixel isolation trench extends from the second surface to the first surface.

19 Claims, 31 Drawing Sheets

(56) References Cited

U.S. PATENT DOCUMENTS

| | | | |
|---|---|---|---|
| 2022/0344383 A1 | 10/2022 | Kao et al. | |
| 2022/0344384 A1 | 10/2022 | Jung et al. | |
| 2022/0344389 A1 | 10/2022 | Pyo et al. | |
| 2023/0143387 A1 | 5/2023 | Matsumoto et al. | |
| 2024/0055458 A1* | 2/2024 | Kim | H10F 39/199 |
| 2024/0153976 A1* | 5/2024 | Huh | H10F 39/199 |

FOREIGN PATENT DOCUMENTS

| | | | |
|---|---|---|---|
| KR | 20220051052 | A | 4/2022 |
| KR | 20220145442 | A | 10/2022 |
| KR | 20220146117 | A | 11/2022 |
| KR | 20220147503 | A | 11/2022 |
| WO | 2021193915 | A1 | 9/2021 |

* cited by examiner

I - I'

I - I'

IMAGE SENSORS HAVING HIGH DENSITY SUBPIXELS THEREIN WITH ENHANCED PIXEL SEPARATION STRUCTURES

REFERENCE TO PRIORITY APPLICATION

This application claims priority under 35 U.S.C. § 119 to Korean Patent Application No. 10-2023-0024590, filed Feb. 23, 2023, the disclosure of which is hereby incorporated herein by reference.

BACKGROUND

The inventive concept relates to an image sensor and an electronic system including the same and, more particularly, to an image sensor having a plurality of photodiodes therein.

With the development of the computer and telecommunication industries, image sensors that capture images and convert them into electrical signals are used in various fields such as digital cameras, camcorders, personal communication systems (PCS), game devices, security cameras, and medical micro cameras. Typically, an image sensor is configured to generate a digital image of an object using photoelectric conversion elements that react according to the intensity of light reflected from an object. Recently, Complementary Metal-Oxide Semiconductor (CMOS)-based image sensors that are capable of providing high resolution are widely used.

SUMMARY

The inventive concept provides an image sensor capable of obtaining high-quality images even when the size of a pixel is reduced.

According to an aspect of the inventive concept, there is provided an image sensor including a substrate having first and second surfaces, which are spaced apart from each other in a vertical direction, with the second surface being opposite to the first surface. A first color unit pixel is also provided, which includes a first subpixel, a second subpixel directly adjacent to the first subpixel in a first direction, a third subpixel directly adjacent to the second subpixel in a second direction perpendicular to the first direction, and a fourth subpixel directly adjacent to the first subpixel in the second direction and the third subpixel in the first direction. A second color unit pixel is provided, which includes four subpixels arranged in a 2×2 matrix. A first pixel isolation trench is provided, which is configured to separate the first color unit pixel and the second color unit pixel. A second pixel isolation trench is provided, which is configured to separate the first subpixel and the second subpixel of the first color unit pixel. A third pixel isolation trench is provided, which is on a point of intersection of the first to fourth subpixels of the first color unit pixel. The first color unit pixel is configured to detect first color light corresponding to a first wavelength. The second color unit pixel is configured to detect second color light corresponding to a second wavelength different from the first wavelength. The image sensor is configured to receive the first color light on the second surface. The second pixel isolation trench extends from the first surface to the second surface. The third pixel isolation trench extends from the second surface to the first surface.

According to another aspect of the inventive concept, an image sensor is provided, which includes a substrate having first and second surfaces thereon that are spaced apart from each other in a vertical direction, with the second surface being opposite to the first surface. A first color unit pixel is provided, which includes a plurality of subpixels arranged in a 2×2 matrix in the substrate. A second color unit pixel is provided which includes a plurality of subpixels arranged in a 2×2 matrix in the substrate, wherein the second color unit pixel is disposed directly adjacent to the first color unit pixel. A first pixel isolation trench is provided which includes a first separation structure around the first color unit pixel, a left separation structure extending from a left boundary of the first color unit pixel to the center of the first color unit pixel, a right separation structure extending from a right boundary opposing the left boundary of the first color unit pixel to the center of the first color unit pixel, a top separation structure extending from a top boundary of the first color unit pixel to the center of the first color unit pixel, and a bottom separation structure extending from a bottom boundary opposing the top boundary of the first color unit pixel to the center of the first color unit pixel.

The first color unit pixel is configured to detect first color light corresponding to a first wavelength. The second color unit pixel is configured to detect second color light corresponding to a second wavelength different from the first wavelength. The left, right, top, and bottom separation structures are connected to the first separation structure. The first, left, right, top, and bottom separation structures are configured to penetrate the substrate. The left separation structure is spaced apart from the right separation structure. The top separation structure is spaced apart from the bottom separation structure.

According to another aspect of the inventive concept, an image sensor is provided, which includes a substrate having first and second surfaces thereon that are spaced apart from each other in a vertical direction, with the second surface being opposite to the first surface. A plurality of interlayer insulating films and a plurality of wiring layers are provided which are disposed on the first surface of the substrate. A color filter and a micro lens are provided which are disposed on the second surface of the substrate. A first color unit pixel is provided which includes a first subpixel, a second subpixel directly adjacent to the first subpixel in a first direction, a third subpixel directly adjacent to the second subpixel in a second direction perpendicular to the first direction, and a fourth subpixel directly adjacent to the first subpixel in the second direction and the third subpixel in the first direction. A second color unit pixel is provided which includes four subpixels arranged in a 2×2 matrix. A first pixel isolation trench is provided which is configured to separate the first color unit pixel and the second color unit pixel. A second pixel isolation trench is provided which is configured to separate the first subpixel and the second subpixel of the first color unit pixel. A third pixel isolation trench is provided which is on a point of intersection of the first to fourth subpixels of the first color unit pixel. The first color unit pixel is configured to detect first color light corresponding to a first wavelength. The second color unit pixel is configured to detect second color light corresponding to a second wavelength different from the first wavelength. The image sensor is configured to receive the first color light on the second surface. The second pixel isolation trench extends from the first surface to the second surface. The third pixel isolation trench extends from the second surface to the first surface.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
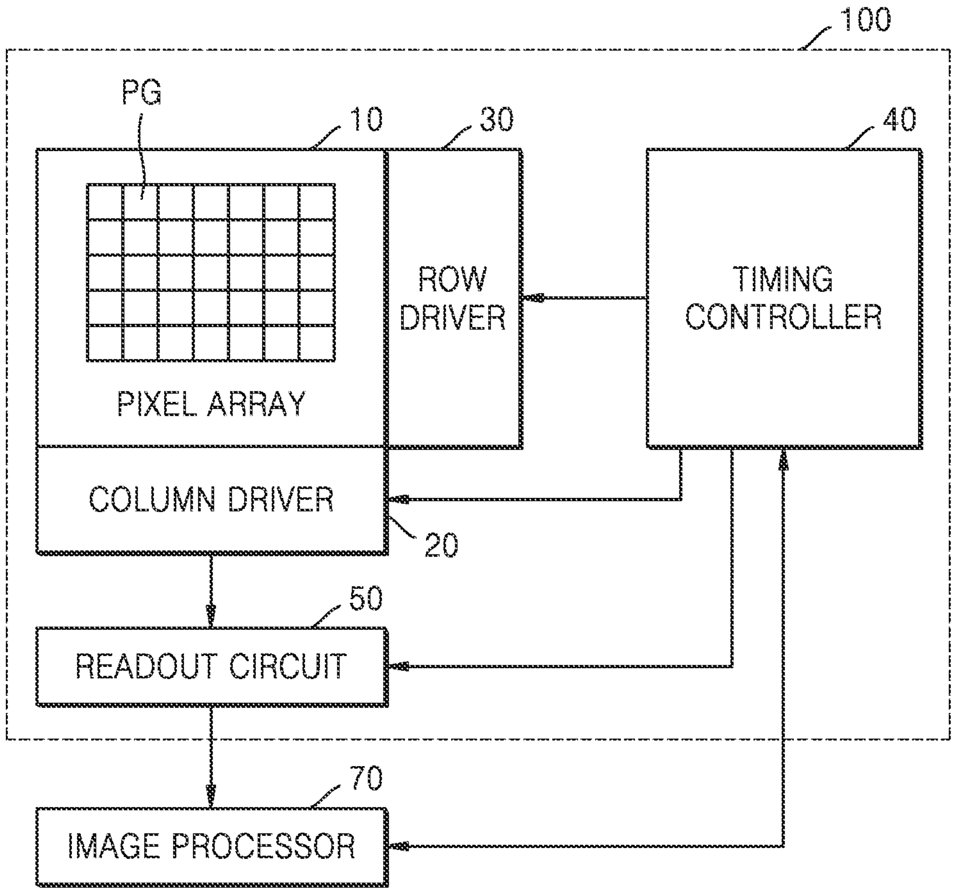
FIG. 1 is a block diagram illustrating an image sensor according to an embodiment.

Hereinafter, embodiments will be described in detail with reference to the accompanying drawings. The same reference numerals are used for the same components in the drawings, and duplicate descriptions thereof are omitted.

FIG. 1 is a block diagram illustrating an image sensor 100 according to an embodiment, which may include a pixel array 10 and circuits for controlling the pixel array 10. In some example embodiments, circuits for controlling the pixel array 10 may include a column driver 20, a row driver 30, a timing controller 40, and a readout circuit 50. The image sensor 100 may operate according to a control command received from an image processor 70, and may convert light transmitted from an external object into an electrical signal and output the converted electrical signal to the image processor 70. The image sensor 100 may be a complementary metal oxide semiconductor (CMOS) image sensor in some embodiments.

The pixel array 10 may include a plurality of pixel groups PG having a two-dimensional array structure arranged in a matrix form along a plurality of row lines and a plurality of column lines. The term "row" used herein refers to a set of a plurality of unit pixels arranged in a horizontal direction among a plurality of unit pixels included in the pixel array 10, and the term "column" used herein refers to a set of a plurality of unit pixels arranged in a vertical direction among a plurality of unit pixels included in the pixel array 10.

Each of the plurality of pixel groups PG may have a multi-pixel structure including a plurality of photodiodes. In each of the plurality of pixel groups PG, a plurality of photodiodes may generate charge by receiving light transmitted from an object. The image sensor 100 may perform an autofocus function using a phase difference between pixel signals generated from a plurality of photodiodes included in each of a plurality of pixel groups PG. Each of the plurality of pixel groups PG may include a pixel circuit for generating a pixel signal from charges generated by a plurality of photodiodes.

The plurality of pixel groups PG may reproduce an object with a combination of red pixels, green pixels, and/or blue pixels. In example embodiments, the pixel group PG may include a plurality of color unit pixels configured in a Bayer pattern including red, green, and blue colors. Each of the plurality of color unit pixels included in the pixel group PG may include a plurality of subpixels arranged in an M×N matrix. Here, M and N may each be a natural number of 2 or more, for example, a natural number of 2 to 10. Each of the plurality of subpixels included in one color unit pixel may receive light passing through a color filter of the same color.

The column driver 20 may include a Correlated Double Sampler (CDS), an Analog-to-Digital Converter (ADC), and the like. The CDS is connected to a subpixel SP1 included in a row selected by a row selection signal supplied by the row driver 30 through column lines, and is configured to perform correlated double sampling to detect a reset voltage and a pixel voltage. The ADC may convert the reset voltage and the pixel voltage detected by the CDS into digital signals and transmit the reset voltage and the pixel voltage to the readout circuit 50.

The read-out circuit 50 may include a latch or buffer circuit and an amplification circuit capable of temporarily storing a digital signal, and generate image data by temporarily storing or amplifying the digital signal received from the column driver 20. Operational timings of the column driver 20, the row driver 30, and the readout circuit 50 may be determined by the timing controller 40, and the timing controller 40 may operate according to a control command transmitted by the image processor 70. This image processor 70 may signal-process image data output from the readout circuit 50 and output the signal to a display device or store the image data in a storage device such as a memory. When the image sensor 100 is mounted on an autonomous vehicle, the image processor 70 may process image data and transmit the image data to a main controller that controls the autonomous vehicle.

Figure 2:
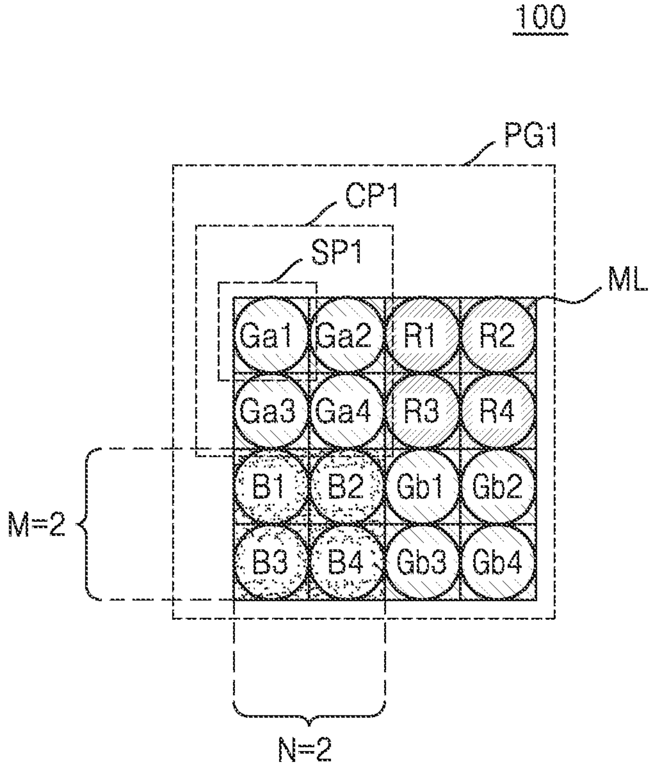
FIG. 2 is a diagram for describing an exemplary pixel group that may be included in an image sensor.

FIG. 2 is a diagram for describing an exemplary pixel group PG1, which may be included in an image sensor. This pixel group PG1 may constitute at least one of the plurality of pixel groups PG described with reference to FIG. 1. The pixel group PG1 may include four color unit pixels CP1 constituting a Bayer pattern including red, green, and blue colors. Each of the plurality of color unit pixels CP1 may include four subpixels SP1 arranged in a 2×2 matrix. The pixel group PG1 may include a first green color unit pixel including four first green subpixels Ga1, Ga2 Ga3, and Ga4 arranged in a 2×2 matrix, a red color unit pixel including four red subpixels R1, R2, R3, and R4 arranged in a 2×2 matrix, a blue color unit pixel including four blue subpixels B1, B2, B3, and B4 arranged in a 2×2 matrix, and a second green color unit pixel including four second green subpixels Gb1, Gb2, Gb3, and Gb4 arranged in a 2×2 matrix. One color unit pixel CP1 may include one microlens ML covering four subpixels SP1. The four microlenses ML may be disposed to correspond to the four color unit pixels CP1. The pixel group PG1 configured in the arrangement illustrated in FIG. 2 may be referred to as a tetra (i.e., "4") cell. In some embodiments, the pixel group PG1 may include two green color unit pixels, one red color unit pixel, and one blue color unit pixel. One color unit pixel CP1 may include four subpixels SP1 having the same color information.

Figure 3A:
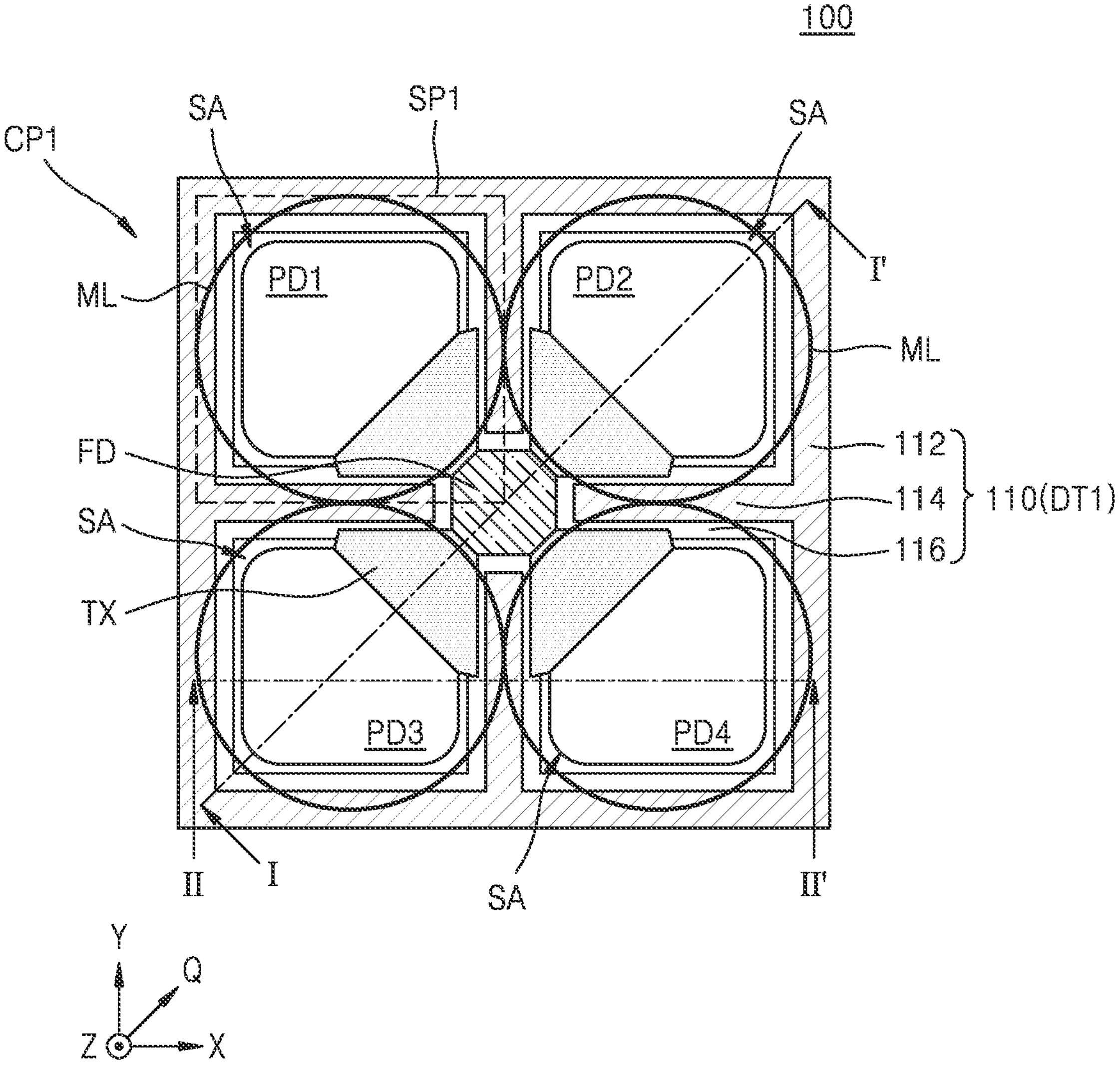
FIGS. 3A to 3E are diagrams for explaining a configuration of an image sensor in more detail.
Figure 3B:
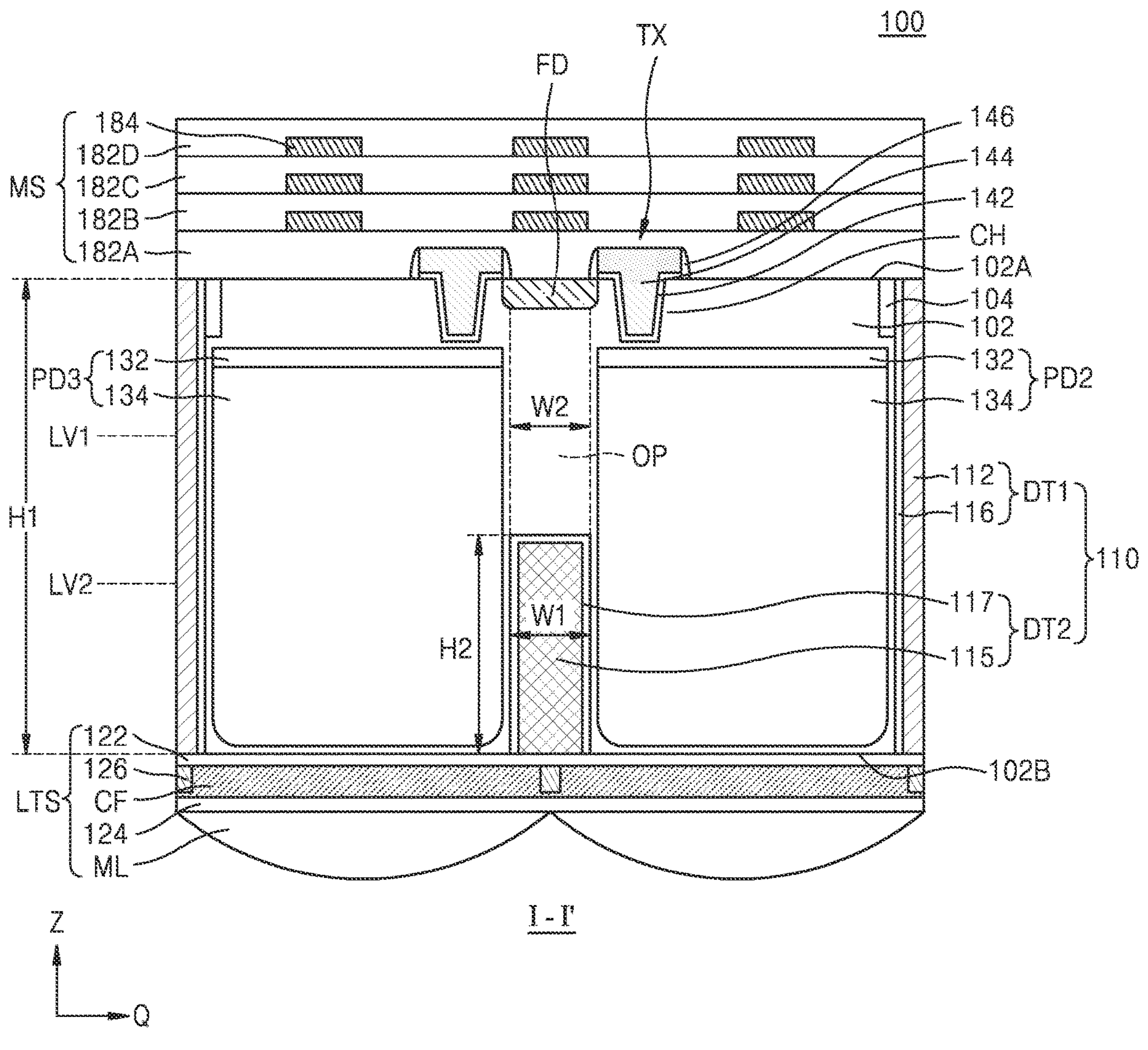
Figure 3C:
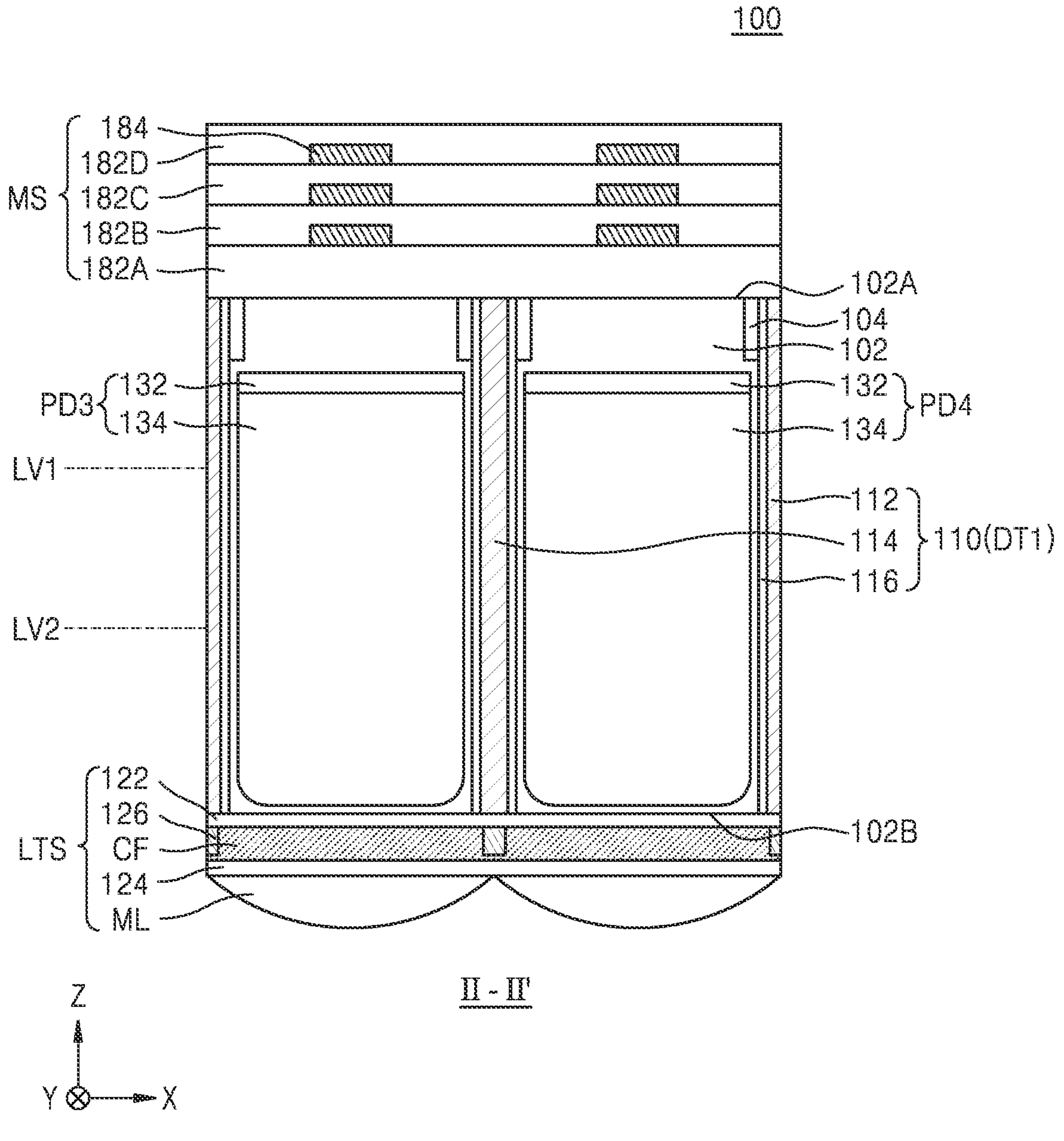
Figure 3D:
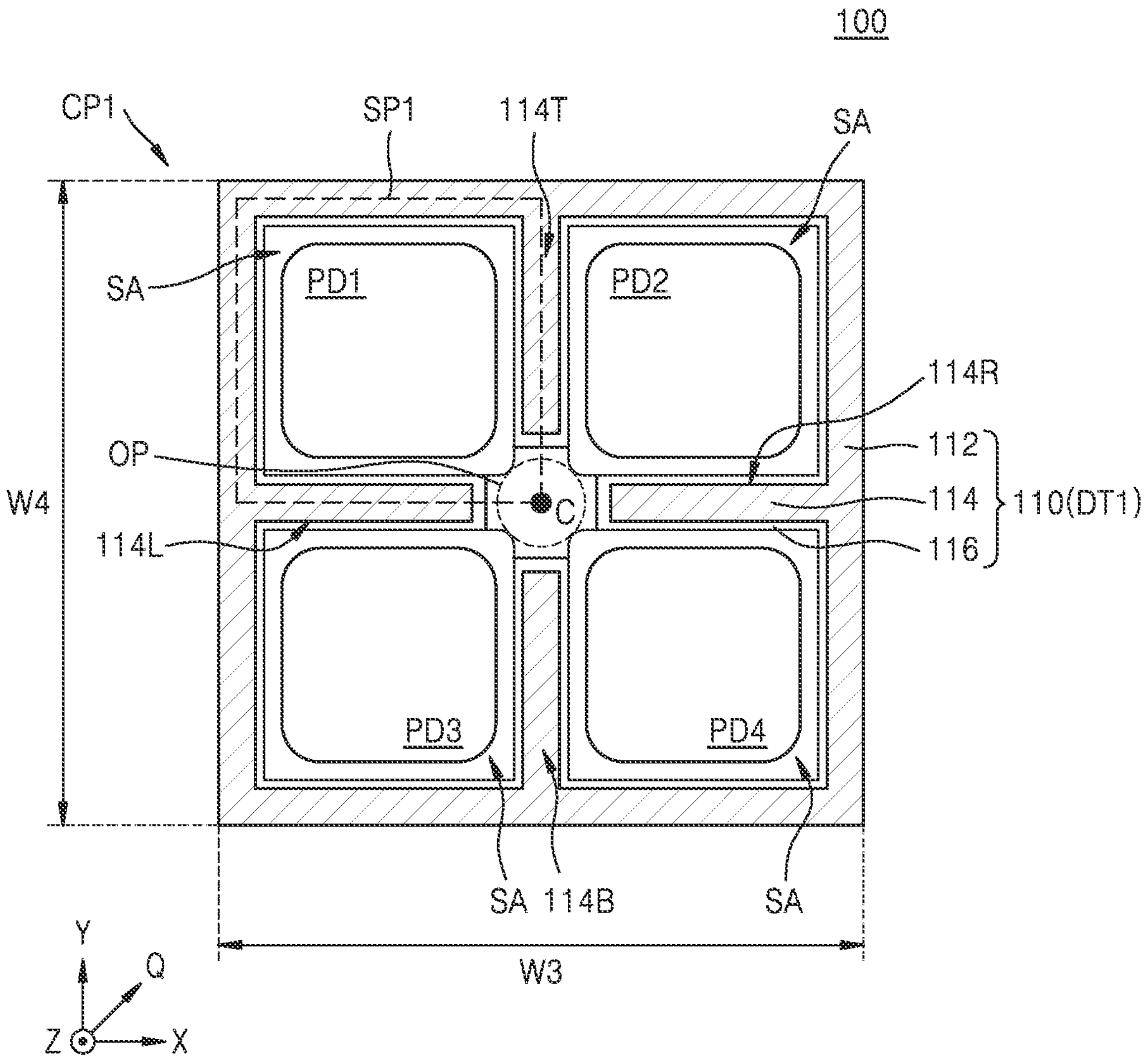
Figure 3E:
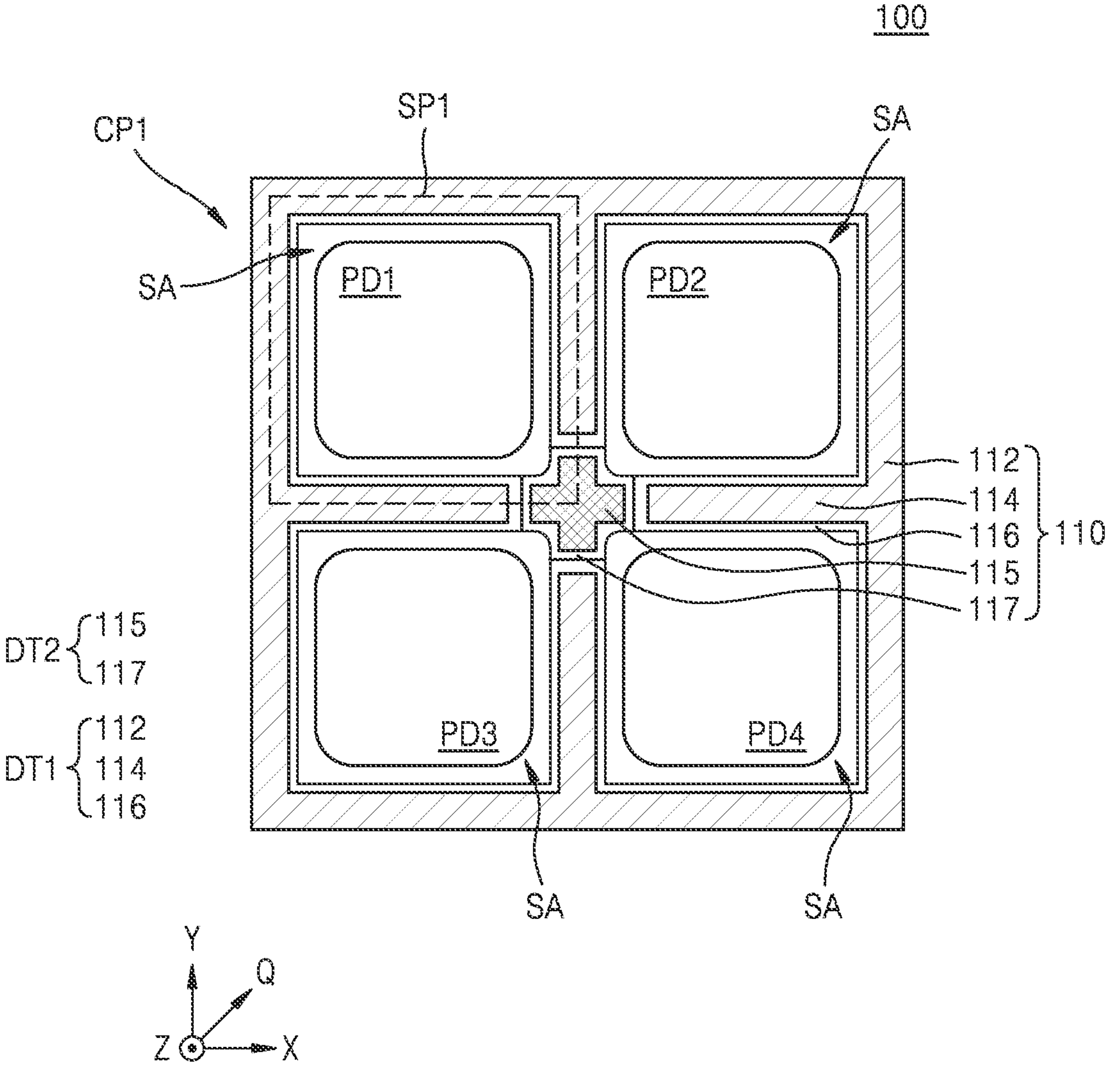

FIGS. 3A to 3E are diagrams for explaining the configuration of an image sensor in more detail. In particular, FIG. 3A is a plan view for explaining an exemplary structure of the subpixel SP1 illustrated in FIG. 2; FIG. 3B is a cross-sectional view taken along line I-I' of FIG. 3A; FIG. 3C is a cross-sectional view taken along line II-II' of FIG. 3A; FIG. 3D is a plan view showing some components of the image sensor 100 at the first vertical level LV1 illustrated in FIGS. 3B and 3C; and FIG. 3E is a plan view showing some components of the image sensor 100 at the second vertical level LV2 illustrated in FIGS. 3B and 3C.

An exemplary configuration of the color unit pixel CP1 included in the image sensor 100 will be described with reference to FIGS. 3A to 3E. The first vertical level LV1 may be located at a higher vertical level than the second vertical level LV2, as shown by FIG. 3B.

Referring to FIGS. 3A to 3E, the image sensor 100 may include a color unit pixel CP1 including four subpixels SP1 arranged in a 2×2 matrix on the substrate 102, and a pixel separation structure 110 configured to separate the four subpixels SP1 from each other in the color unit pixel CP1. The four subpixels SP1 may include a sensing area SA defined by the outer separation layer 112. The sensing area SA may be an area that senses light incident from the outside of the color unit pixel CP1. The plurality of the sensing area SA may be formed spaced apart from each other in an X direction and a Y direction, and each of the sensing area SA may extend in an oblique direction so as to have a long axis in a direction different from the X direction and the Y direction (a Q direction). For example, four subpixels SP1 included in one color unit pixel CP1 may be formed of pixels of the same color. FIGS. 3A to 3E illustrate a configuration in which the color unit pixel CP1 includes four subpixels SP1 defined by the pixel separation structure 110, but various modifications and changes are possible within the scope of the technical idea of the inventive concept. The color unit pixel CP1 may include a plurality of subpixels arranged in an M×N matrix, where M and N may each be a natural number greater than or equal to 2, for example, a natural number between 2 and 10.

The substrate 102 may be made of a semiconductor layer. In example embodiments, the substrate 102 may be formed of a semiconductor layer doped with a P-type impurity. For example, the substrate 102 may be formed of a semiconductor layer made of Si, Ge, SiGe, a II-VI compound semiconductor, a III-V compound semiconductor, or a combination thereof. In embodiments, the substrate 102 may be formed of a P-type epitaxial semiconductor layer epitaxially grown from a P-type bulk silicon substrate. The substrate 102 may include a first surface 102A and a second surface 102B that are opposite surfaces to each other. The first surface 102A may be, for example, a frontside surface of the substrate 102, and the second surface 102B may be, for example, a backside surface of the substrate 102.

The color unit pixel CP1 may include a plurality of photodiodes disposed one by one inside each of the plurality of subpixels SP1. For example, each of the plurality of subpixels SP1 may have the same size as each other. In another embodiment, at least two subpixels SP1 among the plurality of subpixels SP1 may have different sizes. The plurality of photodiodes may include first to fourth photodiodes PD1, PD2, PD3, and PD4. One subpixel SP1 may include one photodiode selected from among the first to fourth photodiodes PD1, PD2, PD3, and PD4. The color unit pixel CP1 may have a structure in which the first to fourth photodiodes PD1, PD2, PD3, and PD4 share one floating diffusion region FD. The first to fourth photodiodes PD1, PD2, PD3, and PD4 may be disposed around the floating diffusion region FD in the sensing area SA, respectively. The first to fourth photodiodes PD1, PD2, PD3, and PD4 may be disposed outside the floating diffusion region FD in a radial direction so as to surround the floating diffusion region FD. For example, each of the first to fourth photodiodes PD1, PD2, PD3, and PD4 may have the same size.

The transfer transistors TX of the four subpixels SP1 included in one color unit pixel CP1 may share one floating diffusion region FD as a common drain region. FIGS. 3A to 3E illustrate a case in which four subpixels SP1 included in one color unit pixel CP1 share one floating diffusion region FD, but the technical spirit of the inventive concept is not limited thereto. According to the technical idea of the inventive concept, each of the four subpixels SP1 included in one color unit pixel CP1 may have a structure in which each of the four subpixels SP1 included in one color unit pixel CP1 includes a separate floating diffusion region FD, or at least two of the four subpixels SP1 share one floating diffusion region.

As illustrated in FIGS. 3A to 3E, the image sensor 100 may include a pixel separation structure 110 configured to separate the plurality of subpixels SP1 from each other in the color unit pixel CP1. The pixel separation structure 110 may include an outer separation film 112, a plurality of inner separation films 114, a lower separation film 115, a first liner 116, and a second liner 117.

The outer separation film 112, the plurality of inner separation films 114, and the first liner 116 may form a first separation structure DT1, and the lower separation film 115 and the second liner 117 may form a second separation structure DT2. In addition, the outer separation film 112 and the plurality of inner separation films 114 together may be referred to as a first separation film, and the lower separation film 115 may be referred to as a second separation film.

The first separation structure DT1 may be formed to penetrate the substrate 102 in a vertical direction (Z direction) from the first surface 102A of the substrate 102 and extend to the second surface 102B. The second separation structure DT2 may be formed penetrating at least a part of the substrate 102 in a vertical direction (Z direction) on the second surface 102B of the substrate 102. For example, the second separation structure DT2 may extend to a point spaced apart from the first surface 102A of the substrate 102 in the vertical direction (Z direction). The outer separation film 112, the plurality of inner separation films 114, and the first liner 116 may be integrally connected to each other, and the lower separation film 115 and the second liner 117 may be integrally connected to each other. For example, the first separation structure DT1 may be a Frontside Deep Trench Isolation (FDTI) type separation structure, and the second separation structure DT2 may be a Backside Deep Trench Isolation (BDTI) type separation structure.

In this specification, a direction parallel to the main surface of the substrate 102 may be defined as a horizontal direction (X direction and/or Y direction), and a direction perpendicular to the horizontal direction (X direction and/or Y direction) may be defined as a vertical direction (Z direction).

In the pixel separation structure 110, the outer separation film 112 may surround the color unit pixel CP1 to limit the size of the color unit pixel CP1. The plurality of inner separation films 114 may limit the size of a partial area of each of the plurality of subpixels SP1 within the area defined by the outer separation film 112. Each of the plurality of inner separation films 114 may include a portion disposed between two adjacent subpixels SP1 among the plurality of subpixels SP1. The first liner 116 may cover a sidewall of the outer separation film 112 facing the sensing area SA and a sidewall of each of the plurality of inner separation films 114 facing the first to fourth photodiodes PD1, PD2, PD3, and PD4. The first liner 116 may be conformally formed inside a first trench 110T.

As illustrated in FIGS. 3B and 3C, an upper sidewall adjacent the first surface 102A of the substrate 102 in the first liner 116 of the pixel separation structure 110 may be covered with a local separation film 104. The local separation film 104 may be made of a silicon oxide film, but is not limited thereto.

The first separation structure DT1 may not be formed in an area adjacent to the center of the color unit pixel CP1, which is referred to herein as an opening area OP. For example, the opening area OP may overlap the floating diffusion region FD in a vertical direction (Z direction). In another embodiment, at least a portion of the opening area OP may overlap at least a portion of the floating diffusion region FD in a vertical direction (Z direction). For example, the opening area OP may be formed of a silicon area doped with P-type impurities, but may not overlap with the photodiode in a vertical direction (Z direction). A plurality of subpixels SP1 may be electrically coupled to each other via the opening area OP.

From a plan view, the second separation structure DT2 may be formed in the opening area OP. The second liner 117 may be formed to cover sidewalls and upper surfaces of the lower separation film 115. The second liner 117 may be disposed on the upper surface and sidewalls of the second trench 115T (see FIG. 18). The second liner 117 may be conformally formed inside the second trench 115T (see FIG. 18). The lower separation film 115 may be formed on the second liner 117 while filling the second trench 115T. A horizontal cross section of each of the lower separation film 115 and the second liner 117 may have a cross shape. The lower separation film 115 and the second liner 117 may be in contact with four subpixels SP1 included in one color unit pixel CP1, and may limit the size of a partial area of each of the plurality of subpixels SP1 together with the plurality of inner separation films 114. For example, the lower separation film 115 and the second liner 117 may contact sensing areas of each of four subpixels SP1 included in one color unit pixel CP1.

In this specification, the lower surface of a component may refer to a surface closer to the micro lens ML among two surfaces spaced apart in a vertical direction (Z direction), and an upper surface of a certain component may refer to a surface opposite to the lower surface among the two surfaces.

The color unit pixel CP1 may have a third width W3, which is a horizontal width of the color unit pixel CP1 in the first horizontal direction (X direction) and a fourth width W4, which is a horizontal width of the color unit pixel CP1 in the second horizontal direction (Y direction). In some embodiments, the third width W3 and the fourth width W4 may be equal to each other. In other embodiments, the third width W3 may be different from the fourth width W4.

From a plan view, the first separation structure DT1 may include the outer separation film 112 which surrounds the outer region (i.e., boundary) of the color unit pixel CP1 and the inner separation film 114 which extends CP1 from the outer separation film 112 to a center C of the color unit pixel CP1. For example, the inner separation film 114 which extends from the left portion (i.e., left boundary) of the color unit pixel CP1 to the right direction (i.e., the center C of the color unit pixel CP1) may be referred to as a left separation film 114L, and the inner separation film 114 which extends from the right portion (i.e., right boundary) of the color unit pixel CP1 to the left direction (i.e., the center C of the color unit pixel CP1) may be referred to as a right separation film 114R. Also, the inner separation film 114 which extends from the top portion (i.e., top boundary) of the color unit pixel CP1 to the downward direction (i.e., the center C of the color unit pixel CP1) may be referred to as a top separation film 114T, and the inner separation film 114 which extends from the bottom portion (i.e., bottom boundary) of the color unit pixel CP1 to the upward direction (i.e., the center C of the color unit pixel CP1) may be referred to as a bottom separation film 114B.

Distances from the center C of the color unit pixel CP1 to each of the right separation film 114R and the left separation film 114L may be less than ¼ of the third width W3. That is, distances from the center C of the color unit pixel CP1 to each of ends of the right separation film 114R and the left separation film 114L may be less than ¼ of the third width W3. Distances from the center C of the color unit pixel CP1 to each of the right separation film 114R and the left separation film 114L may be less than ⅙ of the third width W3. That is, distances from the center C of the color unit pixel CP1 to each of ends of the right separation film 114R and the left separation film 114L may be less than ⅙ of the third width W3.

Distances from the center C of the color unit pixel CP1 to each of the top separation film 114T and the bottom separation film 114B may be less than ¼ of the fourth width W4. That is, distances from the center C of the color unit pixel CP1 to each of ends of the top separation film 114T and the bottom separation film 114B may be less than ¼ of the fourth width W4. Distances from the center C of the color unit pixel CP1 to each of the right separation film 114R and the left separation film 114L may be less than ⅙ of the fourth width W4. That is, distances from the center C of the color unit pixel CP1 to each of ends of the top separation film 114T and the bottom separation film 114B may be less than ⅙ of the fourth width W4.

Although not shown in FIGS. 3B and 3C, a lower local separation film (not shown) may cover the lower sidewall of the second separation structure DT2. The lower local separation film may be made of a silicon oxide film, but is not limited thereto. The first separation structure DT1 may not overlap the second separation structure DT2 in the vertical direction (Z direction). For example, from a plan view (i.e., plan perspective), the first separation structure DT1 may contact the second separation structure DT2 in a horizontal direction (X direction and/or Y direction), and the second separation structure DT2 may contact the first liner 116 of the first separation structure DT1. As another example, from a plan view, the first separation structure DT1 may be spaced apart from the second separation structure DT2 in a horizontal direction (X direction and/or Y direction).

As illustrated in FIG. 3B, the floating diffusion region FD may be disposed to overlap the second separation structure DT2 in a vertical direction (Z direction). For example, the center of the floating diffusion region FD may be aligned with the center of the second separation structure DT2 in a vertical direction (Z direction).

The floating diffusion region FD may be spaced apart from the second separation structure DT2 in a vertical direction (Z direction). Also, as described above, the second separation structure DT2 may be spaced apart from the first surface 102A of the substrate 102 in a vertical direction (Z direction). That is, the upper surface of the second separation structure DT2 may be positioned at a lower vertical level than the lower surface of the floating diffusion region FD.

In some embodiments, at least a portion of the second separation structure DT2 may overlap at least a portion of the opening area OP in a vertical direction (Z direction). For example, the center of the opening area OP may be aligned with the center of the second separation structure DT2 in a vertical direction (Z direction). The first height H1, which is the vertical height of the substrate 102, may be about 3 micrometers to about 5 micrometers, and the second height H2, which is the vertical height of the second separation structure DT2, may be about 1 micrometer to about 2.5 micrometers. In addition, the first width W1, which is the horizontal width of the second separation structure DT2 in the I-I' cross-section of FIG. 3B, and the second width W2, which is the horizontal width of the opening area OP, may be equal to each other.

Also, a horizontal area of each of the plurality of inner separation films 114 may be larger than that of the second separation structure DT2. For example, the horizontal area of each of the plurality of inner separation films 114 may be greater than the horizontal area of the floating diffusion region FD and/or the horizontal area of the opening area OP, respectively.

In some embodiments, the outer separation film 112 and the plurality of inner separation films 114 may include silicon oxide, silicon nitride, SiCN, SiON, SiOC, polysilicon, metal, metal nitride, metal oxide, borosilicate glass (BSG), phosphosilicate glass (PSG), borophosphosilicate glass (BPSG), plasma enhanced tetraethyl orthosilicate (PE-TEOS), fluoride silicate glass (FSG), carbon doped silicon oxide (CDO), organosilicate glass (OSG), air, or a combination thereof, respectively, but the inventive concepts are not limited thereto. In this specification, the term "air" may refer to the atmosphere or other gases that may exist during the manufacturing process. When at least one of the outer separation film 112 and the plurality of inner separation films 114 includes a metal, the metal may be made of tungsten (W), copper (Cu), or a combination thereof. When at least one of the outer separation film 112 and the plurality of inner separation films 114 includes a metal nitride, the metal nitride may be made of TiN, TaN, or a combination thereof. When at least one of the outer separation film 112 and the plurality of inner separation films 114 includes a metal oxide, the metal oxide may be made of indium tin oxide (ITO), aluminum oxide ($Al_2O_3$), or a combination thereof.

The first liner 116 and the second liner 117 may be formed of at least one of a silicon oxide film, a silicon nitride film, and a silicon oxynitride film, and may also include metal oxides, such as hafnium oxide, aluminum oxide, tantalum oxide, and the like. In some example embodiments, the lower separation film 115 may include a metal oxide such as hafnium oxide, aluminum oxide, or tantalum oxide. The lower separation film 115 may include a material different from that of the second liner 117. In addition, in some embodiments, the lower separation film 115 and the second liner 117 may improve the quality of the image sensor 100 by reducing "parasitic" dark currents within the subpixel SP1.

As illustrated in FIGS. 3B and 3C, a wiring structure MS may be disposed on the first surface 102A of the substrate 102. The wiring structure MS may include first to fourth interlayer insulating films 182A, 182B, 182C, and 182D having a multi-layer structure covering the plurality of transfer transistors TX, and a plurality of wiring layers 184 formed on each of the first to fourth interlayer insulating films 182A, 182B, 182C, and 182D. The number and arrangement of each of the first to fourth interlayer insulating films 182A, 182B, 182C, and 182D and the plurality of wiring layers 184 are not limited to those illustrated in FIGS. 3B and 3C, and various changes and modifications are possible as needed.

The plurality of wiring layers 184 included in the wiring structure MS may include a plurality of transistors electrically connected to the first to fourth photodiodes PD1, PD2, PD3, and PD4 and wirings connected to the plurality of transistors. Electrical signals converted by the first to fourth photodiodes PD1, PD2, PD3, and PD4 may be signal processed in the wiring structure MS. The arrangement of the plurality of wiring layers 184 may be freely arranged regardless of the arrangement of the first to fourth photodiodes PD1, PD2, PD3, and PD4, in some embodiments.

A light transmission structure LTS may be disposed on the second surface 102B of the substrate 102. The light transmission structure LTS may include a first planarization film 122, a plurality of color filters CF, a second planarization film 124, and a plurality of micro lenses ML sequentially stacked on the second surface 102B. The light transmission structure LTS may condense and filter light incident from the outside and provide the light to the sensing area SA.

A plurality of color filters CF may be positioned to correspond to (e.g., overlap) each of the plurality of subpixels SP1. Each of the plurality of color filters CF may cover the sensing area SA of the subpixel SP1 on the second surface 102B of the substrate. A plurality of color filters CF included in one color unit pixel CP1 may be formed of color filters of the same color.

A plurality of color filters CF may be disposed to correspond to the plurality of subpixels SP1, respectively. A plurality of microlenses ML may cover a plurality of subpixels SP1 with a plurality of color filters CF therebetween. Each of the first to fourth photodiodes PD1, PD2, PD3, and PD4 may be covered with one micro lens ML. Each of the plurality of subpixels SP1 may have a backside illumination (BSI) structure that receives light from the second surface 102B (e.g., backside) of the substrate 102. The plurality of microlenses ML may have an outwardly convex shape to condense light incident to the first to fourth photodiodes PD1, PD2, PD3, and PD4.

In the light transmission structure LTS, the first planarization film 122 may be used as a buffer film to prevent damage to the substrate 102 during the manufacturing process of the image sensor 100. The first planarization film 122 and the second planarization film 124 may each be made of a silicon oxide film, a silicon nitride film, a resin, or a combination thereof, but are not limited thereto.

In example embodiments, each of the plurality of color filters CF may include a green color filter, a red color filter, or a blue color filter. In other embodiments, the plurality of color filters CF may include other color filters, such as a cyan color filter, a magenta color filter, or a yellow color filter.

In example embodiments, the light transmission structure LTS may further include an anti-reflection film 126 disposed on the first planarization film 122. The anti-reflection film 126 may be disposed at a position overlapping the pixel separation structure 110 in the vertical direction (Z direction) on the edge portion of the sensing area SA. An upper surface and a sidewall of the anti-reflection film 126 may be covered with a color filter CF. The anti-reflection film 126 may serve to prevent incident light passing through the color filter CF from being reflected or scattered to the side, and thereby reducing light collection efficiency. For example, the anti-reflection film 126 may serve to prevent photons reflected or scattered at the interface between the color filter CF and the first planarization film 122 from moving to another sensing area SA. In example embodiments, the anti-reflection film 126 may include metal. For example, the anti-reflection film 126 may include tungsten (W), aluminum (Al), copper (Cu), or a combination thereof, but is not limited thereto.

As illustrated in FIGS. 3B and 3C, each of the first to fourth photodiodes PD1, PD2, PD3, and PD4 may include a first semiconductor region 132, a second semiconductor region 134, and a junction between the first semiconductor region 132 and the second semiconductor region 134. The first semiconductor region 132 is a semiconductor region doped with P-type impurity and may be disposed adjacent to the first surface 102A of the substrate 102. The first semiconductor region 132 may be used as a hole accumulated device (HAD) region. The impurity concentration of the first semiconductor region 132 may be greater than that of the P-type semiconductor layer constituting the substrate 102. The second semiconductor region 134 is a semiconductor region doped with N-type impurities, and may contact the first semiconductor region 132 at a position spaced apart from the first surface 102A of the substrate 102 with the first semiconductor region 132 therebetween.

As illustrated in FIG. 3B, the transfer transistor TX included in one subpixel SP1 may include a gate dielectric film 142, a transfer gate 144, and a channel region CH. The channel region CH may be disposed adjacent to the gate dielectric film 142 in the substrate 102. Sidewalls of each of the gate dielectric film 142 and the transfer gate 144 may be covered with an insulating spacer 146 on the first surface 102A of the substrate 102. In example embodiments, the gate dielectric film 142 may be formed of a silicon oxide film. In example embodiments, the transfer gate 144 may include at least one of doped polysilicon, a metal, a metal silicide, a metal nitride, and a metal-containing film. For example, the transfer gate 144 may be formed of polysilicon doped with an N-type impurity such as phosphorus (P) or arsenic (As). In example embodiments, each of the insulating spacers 146 may be formed of a silicon oxide film, a silicon nitride film, a silicon oxynitride film, or a combination thereof. However, the constituent materials of each of the gate dielectric film 142, the transfer gate 144, and the insulating spacer 146 are not limited to those illustrated above, and various modifications are possible within the scope of the technical idea of the inventive concept.

The transfer gate 144 of each of the plurality of transfer transistors TX may transfer photocharges generated from one photodiode selected from among the first to fourth photodiodes PD1, PD2, PD3, and PD4 to a floating diffusion region FD. In this example, the case where the plurality of transfer transistors TX have a recess channel transistor structure in which a portion of each transfer gate 144 is buried in the substrate 102 from the first surface 102A of the substrate 102 is shown as an example. However, the technical spirit of the inventive concept is not limited thereto, and transfer transistors having various structures may be employed within the scope of the technical spirit of the inventive concept.

In the sensing area SA of each of the plurality of subpixels SP1, the first to fourth photodiodes PD1, PD2, PD3, and PD4 generate photocharges by receiving light passing through four micro lenses ML covering the second surface 102B of the substrate 102, and the photocharges generated in this way are accumulated in the first to fourth photodiodes PD1, PD2, PD3, and PD4 to generate the first to fourth pixel signals. In a plurality of subpixels SP1, auto-focusing information may be extracted from the first to fourth pixel signals output from the first to fourth photodiodes PD1, PD2, PD3, and PD4.

The image sensor 100 described with reference to FIGS. 1 to 3E includes a pixel separation structure 110 configured to separate a plurality of subpixels SP1 included in a color unit pixel CP1 from each other, and the pixel separation structure 110 includes an outer separation film 112 surrounding the color unit pixel CP1, a plurality of inner separation films 114 including a portion disposed between two adjacent sub-pixels SP1 among the plurality of sub-pixels SP1 in an area defined by the outer separation film 112, a first liner 116 covering the side walls of each of the plurality of inner separation films 114, a lower separation film 115 that contacts the plurality of subpixels SP1 included in one color unit pixel CP1 and defines the size of a partial area of each of the plurality of subpixels SP1 together with the plurality of inner separation films 114, and a second liner 117 covering the upper and side walls of the lower separation film 115. In the manufacturing process of the image sensor 100, the formation process of the outer separation film 112, the plurality of inner separation films 114 and the first liner 116 may be performed separately from the process of forming the lower separation film 115 and the second liner 117.

The lower separation film 115 and the second liner 117 are overlapped with the opening area OP in the vertical direction (Z direction), so that a phenomenon in which charges overflow from the opening area OP to each subpixel SP1 may be prevented. Accordingly, sensitivity and resolution of the image sensor 100 may be improved.

In addition, the lower separation film 115 and the second liner 117 are overlapped with the opening area OP in the vertical direction (Z direction), so that auto-focus characteristics of the image sensor 100 may be improved, the size of an opening area OP may be increased, and a process margin may be secured. Accordingly, sensitivity and resolution of the image sensor 100 may be improved.

Figure 4:
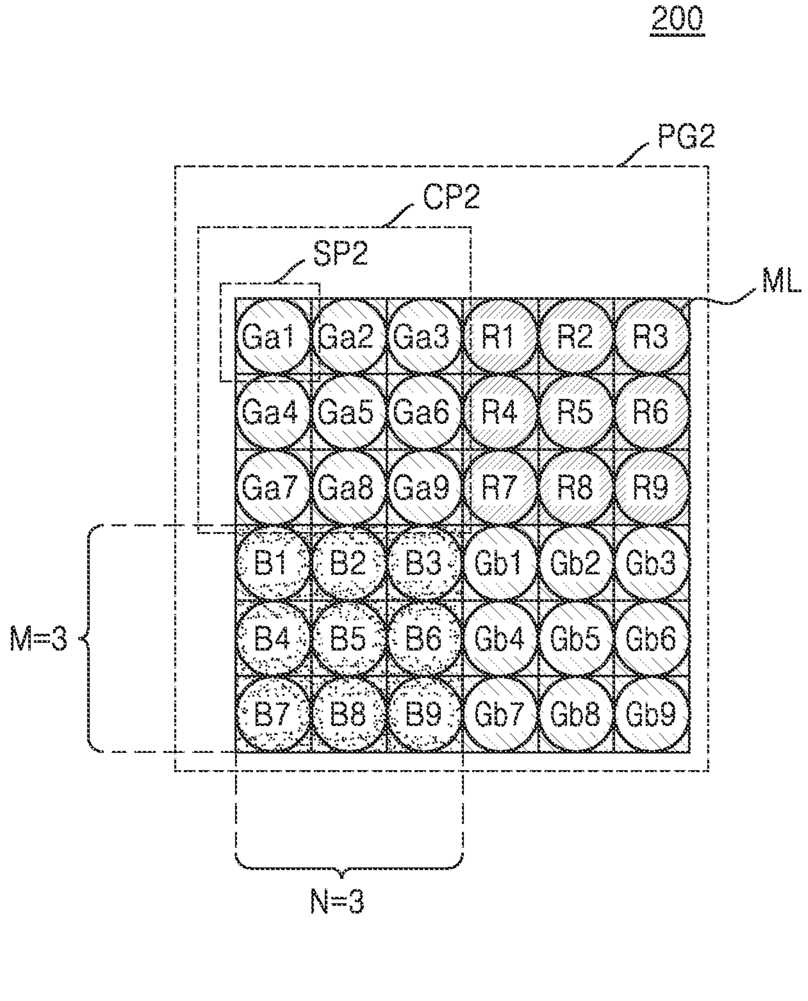
FIG. 4 is a plan view illustrating an image sensor according to an embodiment.

FIG. 4 is a plan view illustrating an image sensor according to an embodiment. FIG. 4 shows an exemplary pixel group PG2 that may be included in the image sensor 200. Referring to FIG. 4, the image sensor 200 may have substantially the same configuration as the image sensor described with reference to FIGS. 1 to 3E. However, as the pixel group PG described with reference to FIG. 1, a pixel group PG2 may be included instead of the pixel group PG1 illustrated in FIG. 2.

The pixel group PG2 may include four color unit pixels CP2 constituting a Bayer pattern including red color, green color, and blue colors. Each of the plurality of color unit pixels CP2 may include nine subpixels SP2 arranged in a 3×3 matrix. The pixel group PG2 may include a first green color unit pixel including nine first green subpixels Ga1, Ga2, Ga3, Ga4, Ga5, Ga6, Ga7, Ga8, and Ga9 arranged in a 3×3 matrix, a red color unit pixel including nine red subpixels R1, R2, R3, R4, R5, R6, R7, R8, and R9 arranged in a 3×3 matrix, a blue color unit pixel including nine blue subpixels B1, B2, B3, B4, B5, B6, B7, B8, and B9 arranged in a 3×3 matrix, and a second green color unit pixel including nine second green subpixels Gb1, Gb2, Gb3, Gb4, Gb5, Gb6, Gb7, Gb8, and Gb9 arranged in a 3×3 matrix. One color unit pixel CP2 may include nine microlenses ML covering nine subpixels SP2. The nine microlenses ML may be arranged to correspond to each of the nine subpixels SP2, as shown. The pixel group PG2 configured in the arrangement illustrated in FIG. 4 may be referred to as a nona cell, which supports nona-binning (instead of tetra-binning). The pixel group PG2 may include two green color unit pixels, one red color unit pixel, and one blue color unit pixel. One color unit pixel CP2 may include nine subpixels SP2 having the same color information.

FIG. 4 illustrates a case where a plurality of color unit pixels CP2 have a nona-cell structure including nine subpixels each arranged in a 3×3 matrix for convenience of description but the technical spirit of the inventive concept is not limited thereto.

Figure 5:
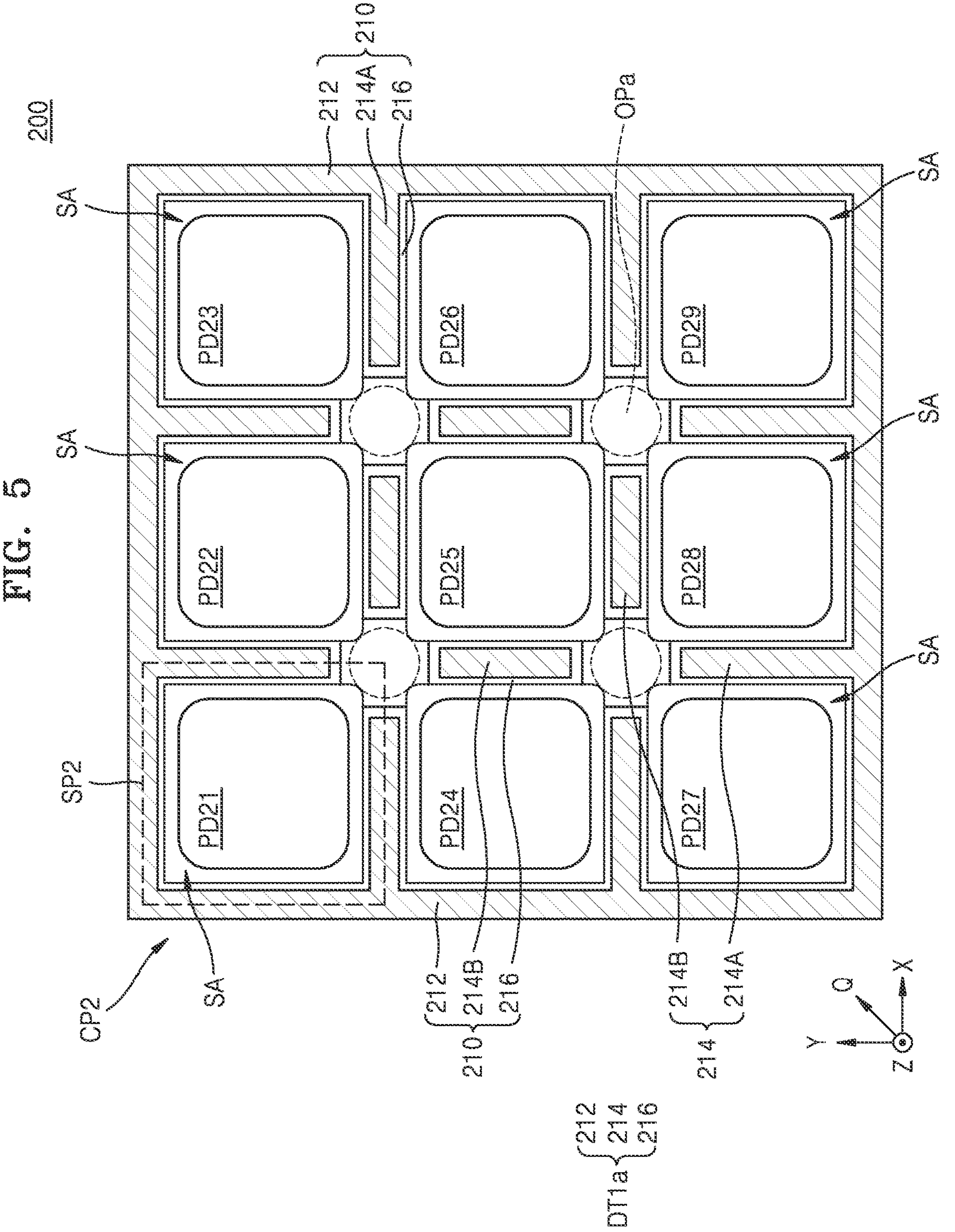
FIGS. 5 and 6 are plan views illustrating the configuration of the image sensor of FIG. 4 in more detail.
Figure 6:
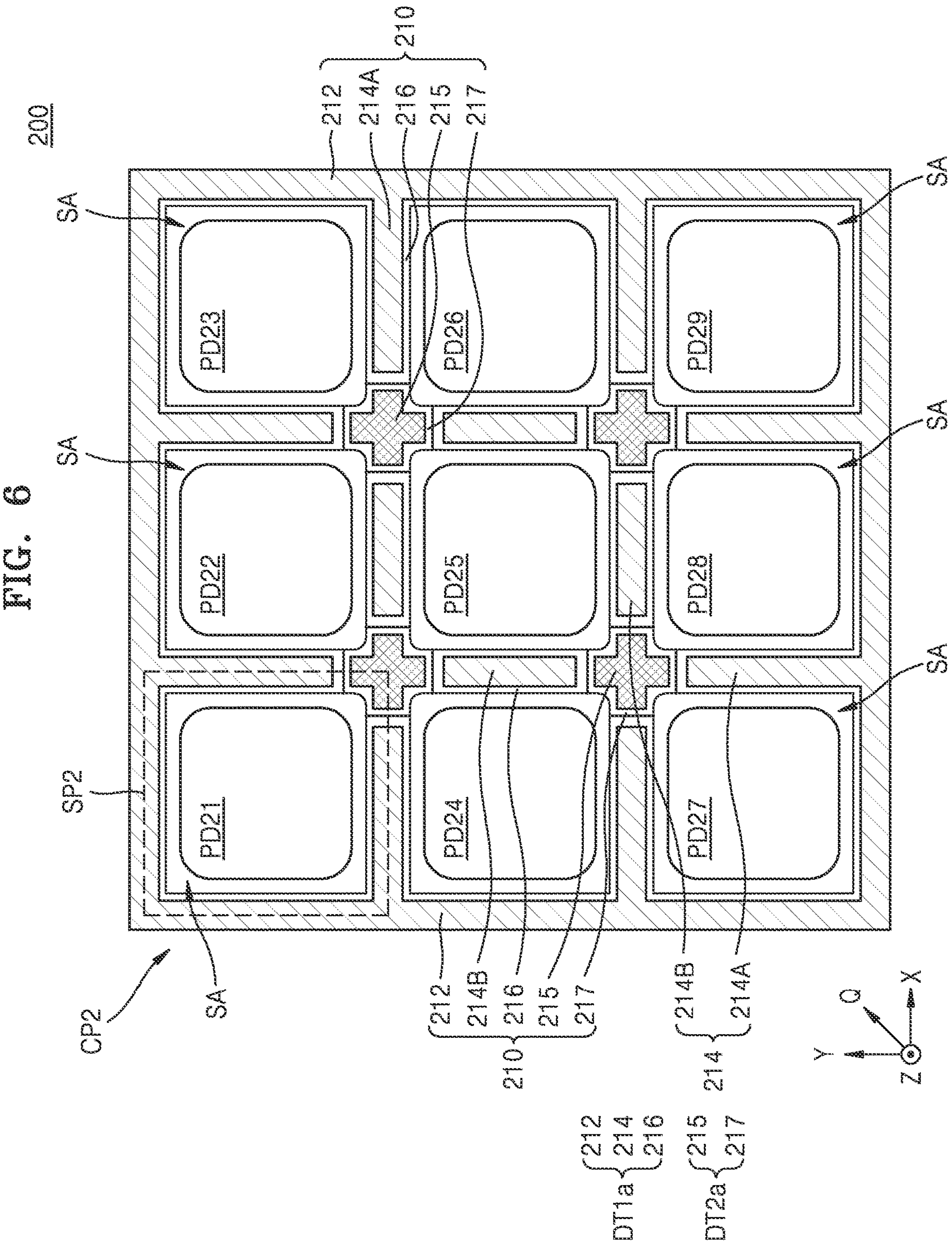

FIGS. 5 and 6 are plan views illustrating the configuration of the image sensor of FIG. 4 in more detail. FIG. 5 shows some configurations of the image sensor 200 at a vertical level corresponding to the first vertical level LV1 illustrated in FIGS. 3B and 3C of the image sensor 200, and FIG. 6 shows some configurations of the image sensor 200 at a vertical level corresponding to the second vertical level LV2 illustrated in FIGS. 3B and 3C of the image sensor 200. An exemplary configuration of the color unit pixel CP2 included in the image sensor 200 will be described with reference to FIGS. 5 and 6. A description will be made with reference to FIGS. 5 and 6 together with FIGS. 3A to 3E.

Referring to FIGS. 5 and 6, the image sensor 200 may have substantially the same configuration as the image sensor 100 described with reference to FIGS. 3A to 3E. However, the image sensor 200 may include a color unit pixel CP2 including nine subpixels SP2 arranged in a 3×3 matrix and a pixel separation structure 210 configured to separate the nine sub-pixels SP2 from each other in the color unit pixel CP2. Nine subpixels SP2 included in one color unit pixel CP2 may be formed of pixels of the same color.

The color unit pixel CP2 may include a plurality of photodiodes, one disposed inside each of the plurality of subpixels SP2. The plurality of photodiodes may include first to ninth photodiodes PD21, PD22, PD23, PD24, PD25, PD26, PD27, PD28, and PD29. One subpixel SP2 may include one photodiode selected from among the first to ninth photodiodes PD21, PD22, PD23, PD24, PD25, PD26, PD27, PD28, and PD29. For example, each of the first to ninth photodiodes PD21, PD22, PD23, PD24, PD25, PD26, PD27, PD28, and PD29 may have the same size.

The pixel separation structure 210 may be configured to separate the plurality of subpixels SP2 from each other in the color unit pixel CP2. The pixel separation structure 210 may include an outer separation film 212, a plurality of inner separation films 214, a lower separation film 215, a first liner 216 and a second liner 217.

The pixel separation structure 210 may include a first separation structure DT1*a* and a second separation structure DT2*a*. The first separation structure DT1*a* may include an outer separation film 212, a plurality of inner separation films 214, and a first liner 216, and the second separation structure DT2*a* may include a lower separation film 215 and a second liner 217.

The outer separation film 212, the plurality of inner separation films 214, the plurality of lower separation films 215, the first liner 216, and the second liner 217 constituting the pixel separation structure 210 may have substantially the same configuration as the outer separation film 112, the plurality of inner separation films 114, the lower separation film 115, the first liner 116 and the second liner 117 described with reference to FIGS. 3A to 3E. However, the plurality of inner separation films 214 may include a plurality of first inner separation films 214A integrally connected to the outer separation film 212 and a plurality of second inner separation films 214B spaced apart from the plurality of first inner separation films 214A in a horizontal direction (X direction and/or Y direction). At least a portion of the first inner separation film 214A and at least a portion of the second inner separation film 214B may be spaced apart in a horizontal direction (X direction and/or Y direction).

Each of the plurality of first inner separation films 214A and the plurality of second inner separation films 214B may have a columnar shape extending from the first surface 102A of the substrate 102 to the second surface 102B in a vertical downward direction. Portions adjacent to the lower surfaces of each of the plurality of first inner separation films 214A and second inner separation films 214B may be spaced apart from each other in a horizontal direction (X direction and/or Y direction).

Also, an opening area OPa in which the first separation structure DT1*a* is not formed may be disposed between the plurality of first inner separation films 214A and the plurality of second inner separation films 214B, which are adjacent to each other. For example, the opening area OPa may be formed of a silicon area doped with P-type impurities. For example, the opening area OPa may not overlap with the photodiode in a vertical direction (Z direction). A plurality of subpixels may be connected through the opening area OPa.

The plurality of second separation structures DT2*a* may be formed to be spaced apart from each other in a horizontal direction (X direction and/or Y direction). From a plan view, the plurality of second separation structures DT2*a* may not overlap the first separation structure DT1*a* in a vertical direction (Z direction). From a plan view, each of the plurality of second separation structures DT2*a* may be formed in different opening areas OPa.

In the pixel separation structure 210, each of the four second separation structures DT2*a* may contact the sensing area SA of each of the four subpixels SP2 selected from among the nine subpixels SP2 included in one color unit pixel CP2. Each of the plurality of first inner separation films 214A are disposed between two subpixels SP2 selected from among nine subpixels SP2 included in one color unit pixel CP2, and may be integrally connected with the outer separation film 212. The plurality of second inner separation films 214B may be disposed between two subpixels SP2 selected from among the nine subpixels SP2, respectively, and may be spaced apart from the first inner separation film 214A in a horizontal direction (X direction and/or Y direction) with the second separation structure DT2*a* disposed therebetween.

Similarly, as described for the lower separation film 115 and the second liner 117 with reference to FIG. 3B, respectively, the plurality of lower separation films 215 and the second liner 217 may have a pillar shape extending through a portion of the substrate 102. For example, the plurality of lower separation films 215 and the second liner 217 may extend from the second surface 102B of the substrate 102 to the first surface 102A in a vertical upward direction. Although not shown, the image sensor 200 may further include a floating diffusion region FD disposed to overlap at least a portion of the plurality of second separation structures DT2*a* in a vertical direction (Z direction). In example embodiments, the lower separation film 215 and the second liner 217 may improve the quality of the image sensor 200 by reducing dark current in the subpixel SP2, respectively.

The image sensor 200 described with reference to FIGS. 5 and 6 includes a pixel separation structure 210 configured to separate the plurality of subpixels SP2 included in the color unit pixel CP2 from each other, and the pixel separation structure 210 includes an outer separation film 212 surrounding the color unit pixel CP2, a plurality of inner separation films 214 including a portion disposed between two adjacent sub-pixels SP2 among the plurality of sub-pixels SP2 in an area defined by the outer separation film 212, a first liner 216 covering each side wall of the plurality of inner separation films 214, a lower separation film 215 that contacts the plurality of subpixels SP2 included in one color unit pixel CP2 and defines the size of a partial area of each of the plurality of subpixels SP2 together with a plurality of inner separation films 214, and a second liner 217 covering the sidewall and upper surface of the lower separation film 215.

The lower separation film 215 and the second liner 217 are overlapped with the opening area OPa in the vertical direction (Z direction), so that a phenomenon in which charges overflow from the opening area OPa to each subpixel SP2 may be prevented. Accordingly, sensitivity and resolution of the image sensor 200 may be improved. In addition, the lower separation film 215 and the second liner 217 are overlapped with the opening area OPa in the vertical direction (Z direction), so that auto-focus characteristics of the image sensor 200 may be improved, the size of an opening area OPa may be increased, and a process margin may be secured. Accordingly, sensitivity and resolution of the image sensor 200 may be improved.

Figure 7:
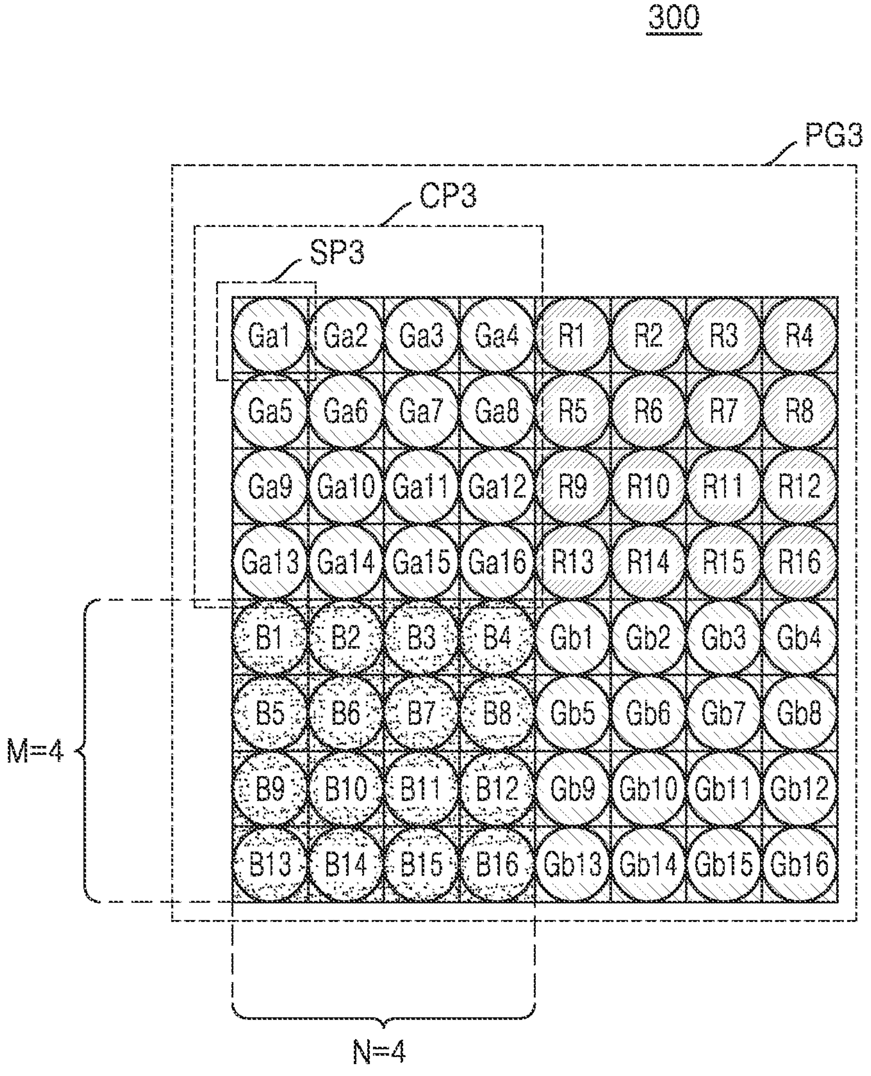
FIG. 7 is a plan view illustrating an image sensor according to an embodiment.

FIG. 7 is a plan view illustrating an image sensor according to an embodiment. FIG. 7 shows an exemplary pixel group PG3 that may be included in the image sensor 300. Referring to FIG. 7, the image sensor 300 may have substantially the same configuration as the image sensor described with reference to FIGS. 1 to 3E. However, as the pixel group PG described with reference to FIG. 1, a pixel group PG3 may be included instead of the pixel group PG1 illustrated in FIG. 2.

The pixel group PG3 may include four color unit pixels CP3 constituting a Bayer pattern including red color, green color, and blue colors. Each of the plurality of color unit pixels CP3 may include sixteen subpixels SP3 arranged in a 4×4 matrix. The pixel group PG3 may include a first green color unit pixel including sixteen first green subpixels Ga1, Ga2, Ga3, Ga4, Ga5, Ga6, Ga7, Ga8, Ga9, Ga10, Ga11, Ga12, Ga13, Ga14, Ga15, and Ga16 arranged in a 4×4 matrix, a red color unit pixel including sixteen red subpixels R1, R2, R3, R4, R5, R6, R7, R8, R9, R10, R11, R12, R13, R14, R15, and R16 arranged in a 4×4 matrix, a blue color unit pixel including sixteen blue subpixels B1, B2, B3, B4, B5, B6, B7, B8, B9, B10, B11, B12, B13, B14, B15, and B16 arranged in a 4×4 matrix, and a second green color unit pixel including sixteen second green subpixels Gb1, Gb2, Gb3, Gb4, Gb5, Gb6, Gb7, Gb8, Gb9, Gb10, Gb11, Gb12, Gb13, Gb14, Gb15, and Gb16 arranged in a 4×4 matrix. One color unit pixel CP3 may include sixteen microlenses ML covering sixteen subpixels SP3. The sixteen microlenses ML may be arranged to correspond to each of the sixteen subpixels SP3, as shown. The pixel group PG3 may include two green color unit pixels, one red color unit pixel, and one blue color unit pixel. One color unit pixel CP3 may include sixteen subpixels SP3 having the same color information.

FIG. 7 illustrates a case where a plurality of color unit pixels CP3 including sixteen sub-pixels each arranged in a 4×4 matrix for convenience of description but the technical spirit of the inventive concept is not limited thereto. The color unit pixel CP3 may include a plurality of subpixels arranged in an M×N matrix, where M and N may each be a natural number greater than or equal to 4, for example, a natural number between 4 and 10.

Figure 8:
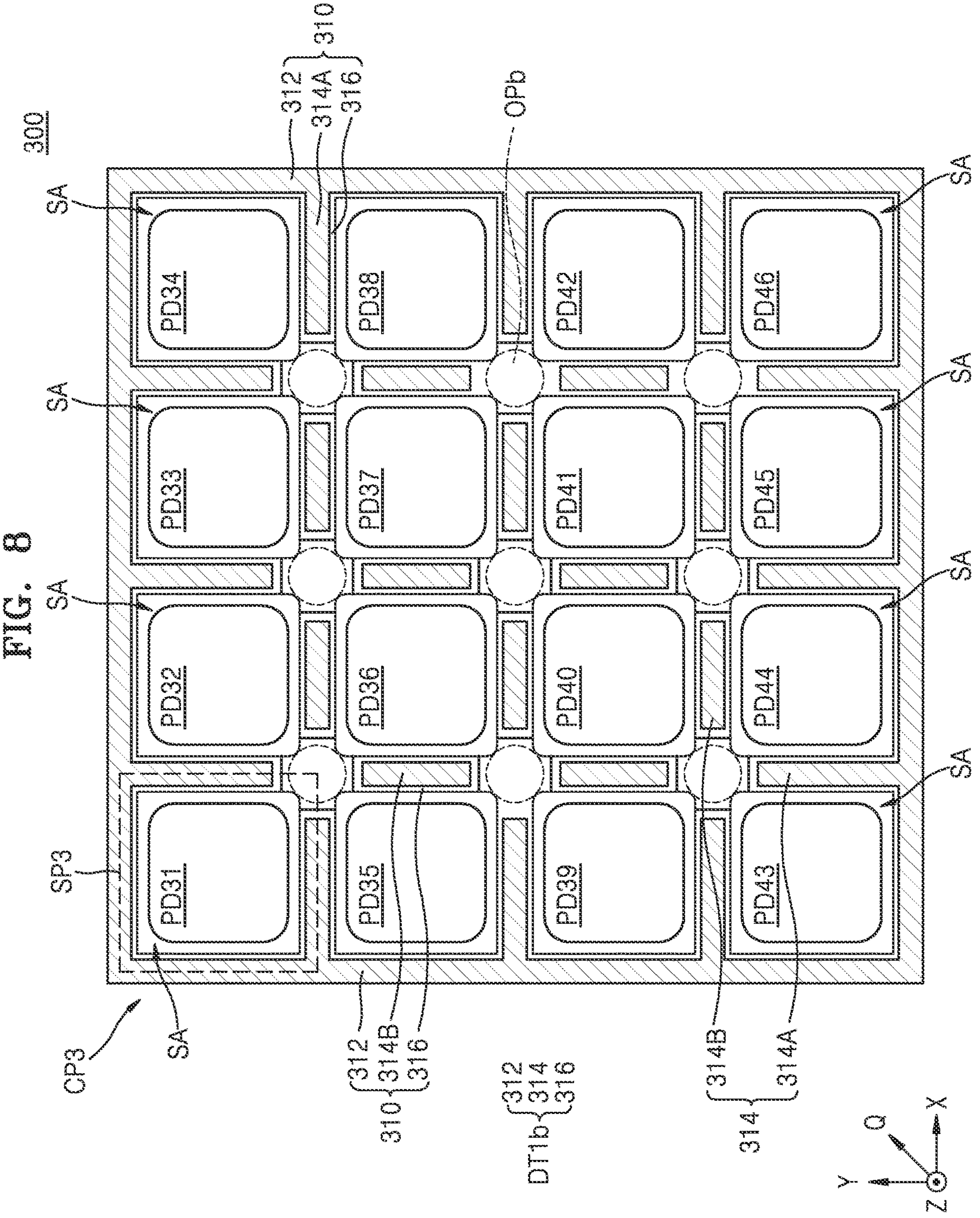
FIGS. 8 and 9 are plan views illustrating the configuration of the image sensor of FIG. 7 in more detail.
Figure 9:
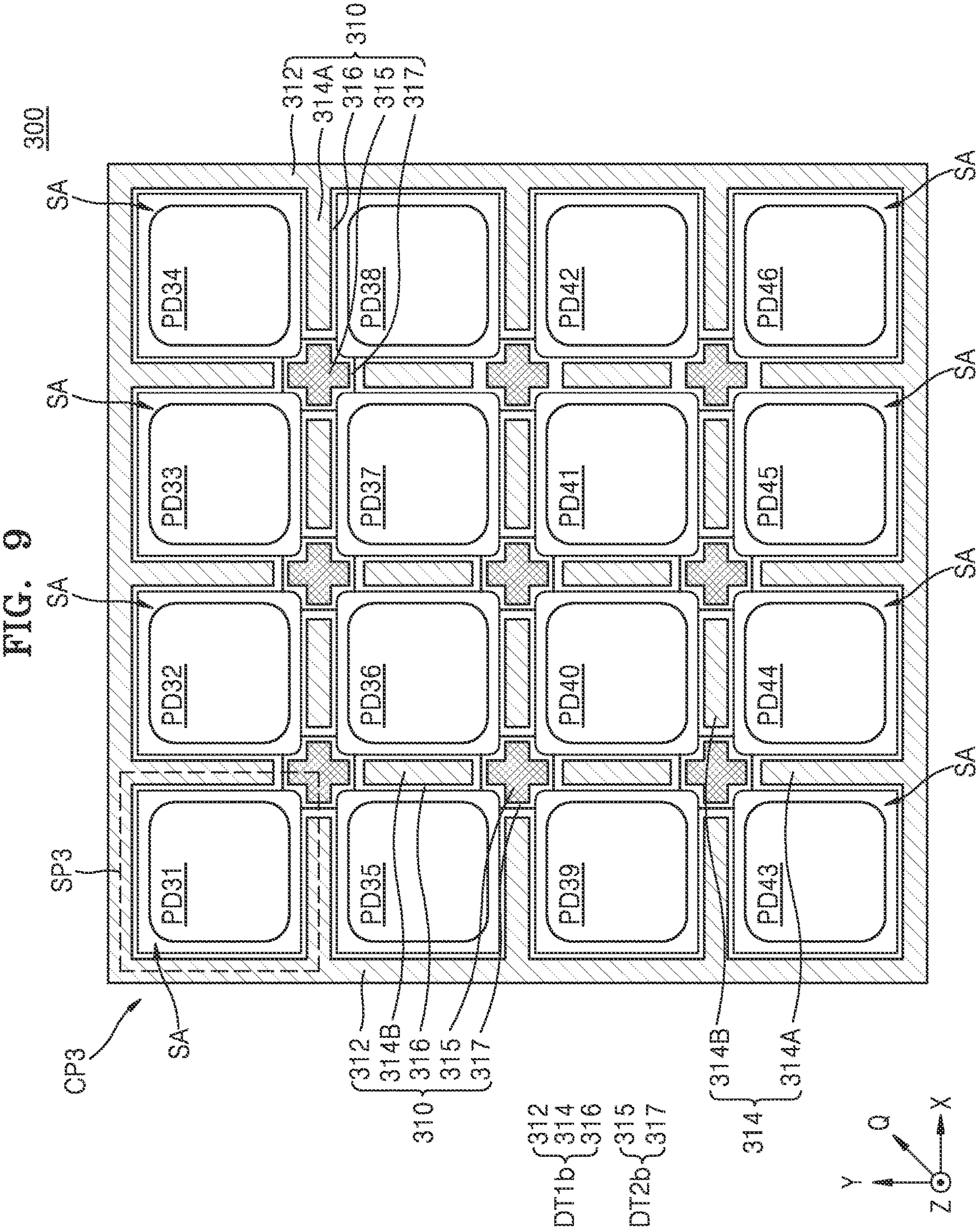

FIGS. 8 and 9 are plan views illustrating the configuration of the image sensor of FIG. 7 in more detail. FIG. 8 shows some configurations of the image sensor 300 at a vertical level corresponding to the first vertical level LV1 illustrated in FIGS. 3B and 3C of the image sensor 300, and FIG. 9 shows some configurations of the image sensor 300 at a vertical level corresponding to the second vertical level LV2 illustrated in FIGS. 3B and 3C of the image sensor 300. An exemplary configuration of the color unit pixel CP3 included in the image sensor 300 will be described with reference to FIGS. 8 and 9. A description will be made with reference to FIGS. 8 and 9 together with FIGS. 3A to 3E.

Referring to FIGS. 8 and 9, the image sensor 300 may have substantially the same configuration as the image sensor 100 described with reference to FIGS. 3A to 3E. However, the image sensor 300 may include a color unit pixel CP3 including sixteen subpixels SP3 arranged in a 4×4 matrix and a pixel separation structure 310 configured to separate the sixteen sub-pixels SP3 from each other in the color unit pixel CP3. Sixteen subpixels SP3 included in one color unit pixel CP3 may be formed of pixels of the same color.

The color unit pixel CP3 may include a plurality of photodiodes, one disposed inside each of the plurality of subpixels SP3. The plurality of photodiodes may include first to sixteenth photodiodes PD31, PD32, PD33, PD34, PD35, PD36, PD37, PD38, PD39, PD40, PD41, PD42, PD43, PD44, PD45, and PD46. One subpixel SP3 may include one photodiode selected from among the first to sixteenth photodiodes PD31, PD32, PD33, PD34, PD35, PD36, PD37, PD38, PD39, PD40, PD41, PD42, PD43, PD44, PD45, and PD46. For example, each of the first to sixteenth photodiodes PD31, PD32, PD33, PD34, PD35, PD36, PD37, PD38, PD39, PD40, PD41, PD42, PD43, PD44, PD45, and PD46 may have the same size.

The pixel separation structure 310 may be configured to separate the plurality of subpixels SP31 from each other in the color unit pixel CP3. The pixel separation structure 310 may include an outer separation film 312, a plurality of inner separation films 314, a lower separation film 315, a first liner 316 and a second liner 317.

The pixel separation structure 310 may include a first separation structure DT1*b* and a second separation structure DT2*b*. The first separation structure DT1*b* may include an outer separation film 312, a plurality of inner separation films 314, and a first liner 316, and the second separation structure DT2*b* may include a lower separation film 315 and a second liner 317.

The outer separation film 312, the plurality of inner separation films 314, the plurality of lower separation films 315, the first liner 316, and the second liner 317 constituting the pixel separation structure 310 may have substantially the same configuration as the outer separation film 112, the plurality of inner separation films 114, the lower separation film 115, the first liner 116 and the second liner 117 described with reference to FIGS. 3A to 3E. However, the plurality of inner separation films 314 may include a plurality of first inner separation films 314A integrally connected to the outer separation film 312 and a plurality of second inner separation films 314B spaced apart from the plurality of first inner separation films 314A in a horizontal direction (X direction and/or Y direction). At least a portion of the first inner separation film 314A and at least a portion of the second inner separation film 314B may be spaced apart in a horizontal direction (X direction and/or Y direction).

Each of the plurality of first inner separation films 314A and the plurality of second inner separation films 314B may have a columnar shape extending from the first surface 102A of the substrate 102 to the second surface 102B in a vertical downward direction. Portions adjacent to the lower surfaces of each of the plurality of first inner separation films 314A and second inner separation films 314B may be spaced apart from each other in a horizontal direction (X direction and/or Y direction).

Also, an opening area OPb in which the first separation structure DT1*b* is not formed may be disposed between the plurality of first inner separation films 314A and the plurality of second inner separation films 314B, which are adjacent to each other. For example, the opening area OPb may be formed of a silicon area doped with P-type impurities. For example, the opening area OPb may not overlap with the photodiode in a vertical direction (Z direction). A plurality of subpixels may be connected through the opening area OPb.

The plurality of second separation structures DT2*b* may be formed to be spaced apart from each other in a horizontal direction (X direction and/or Y direction). From a plan view, the plurality of second separation structures DT2*b* may not overlap the first separation structure DT1*b* in a vertical direction (Z direction). From a plan view, each of the plurality of second separation structures DT2*b* may be formed in different opening areas OPb.

In the pixel separation structure 310, each of the four second separation structures DT2*b* may contact the sensing area SA of each of the four subpixels SP3 selected from among the sixteen subpixels SP3 included in one color unit pixel CP3. Each of the plurality of first inner separation films 314A are disposed between two subpixels SP3 selected from among sixteen subpixels SP3 included in one color unit pixel CP3, and may be integrally connected with the outer separation film 312. The plurality of second inner separation films 314B may be disposed between two subpixels SP3 selected from among the sixteen subpixels SP3, respectively, and may be spaced apart from the first inner separation film 314A in a horizontal direction (X direction and/or Y direction) with the second separation structure DT2*b* disposed therebetween.

Similarly, as described for the lower separation film 115 and the second liner 117 with reference to FIG. 3B, respectively, the plurality of lower separation films 315 and the second liner 317 may have a pillar shape extending through a portion of the substrate 102. For example, the plurality of lower separation films 315 and the second liner 317 may extend from the second surface 102B of the substrate 102 to the first surface 102A in a vertical upward direction. Although not shown, the image sensor 300 may further include a floating diffusion region FD disposed to overlap at least a portion of the plurality of second separation structures DT2*b* in a vertical direction (Z direction). In example embodiments, the lower separation film 315 and the second liner 317 may improve the quality of the image sensor 300 by reducing dark current in the subpixel SP3, respectively.

The image sensor 300 described with reference to FIGS. 8 and 9 includes a pixel separation structure 310 configured to separate the plurality of subpixels SP3 included in the color unit pixel CP3 from each other, and the pixel separation structure 310 includes an outer separation film 312 surrounding the color unit pixel CP3, a plurality of inner separation films 314 including a portion disposed between two adjacent sub-pixels SP3 among the plurality of sub-pixels SP3 in an area defined by the outer separation film 312, a first liner 316 covering each side wall of the plurality of inner separation films 314, a lower separation film 315 that contacts the plurality of subpixels SP3 included in one color unit pixel CP3 and defines the size of a partial area of each of the plurality of subpixels SP3 together with a plurality of inner separation films 314, and a second liner 317 covering the sidewall and upper surface of the lower separation film 315. The lower separation film 315 and the second liner 317 are overlapped with the opening area OPb in the vertical direction (Z direction), so that a phenomenon in which charges overflow from the opening area OPb to each subpixel SP3 may be prevented. Accordingly, sensitivity and resolution of the image sensor 300 may be improved. In addition, the lower separation film 315 and the second liner 317 are overlapped with the opening area OPb in the vertical direction (Z direction), so that auto-focus characteristics of the image sensor 300 may be improved, the size of an opening area OPb may be increased, and a process margin may be secured. Accordingly, sensitivity and resolution of the image sensor 300 may be improved.

Figure 10:
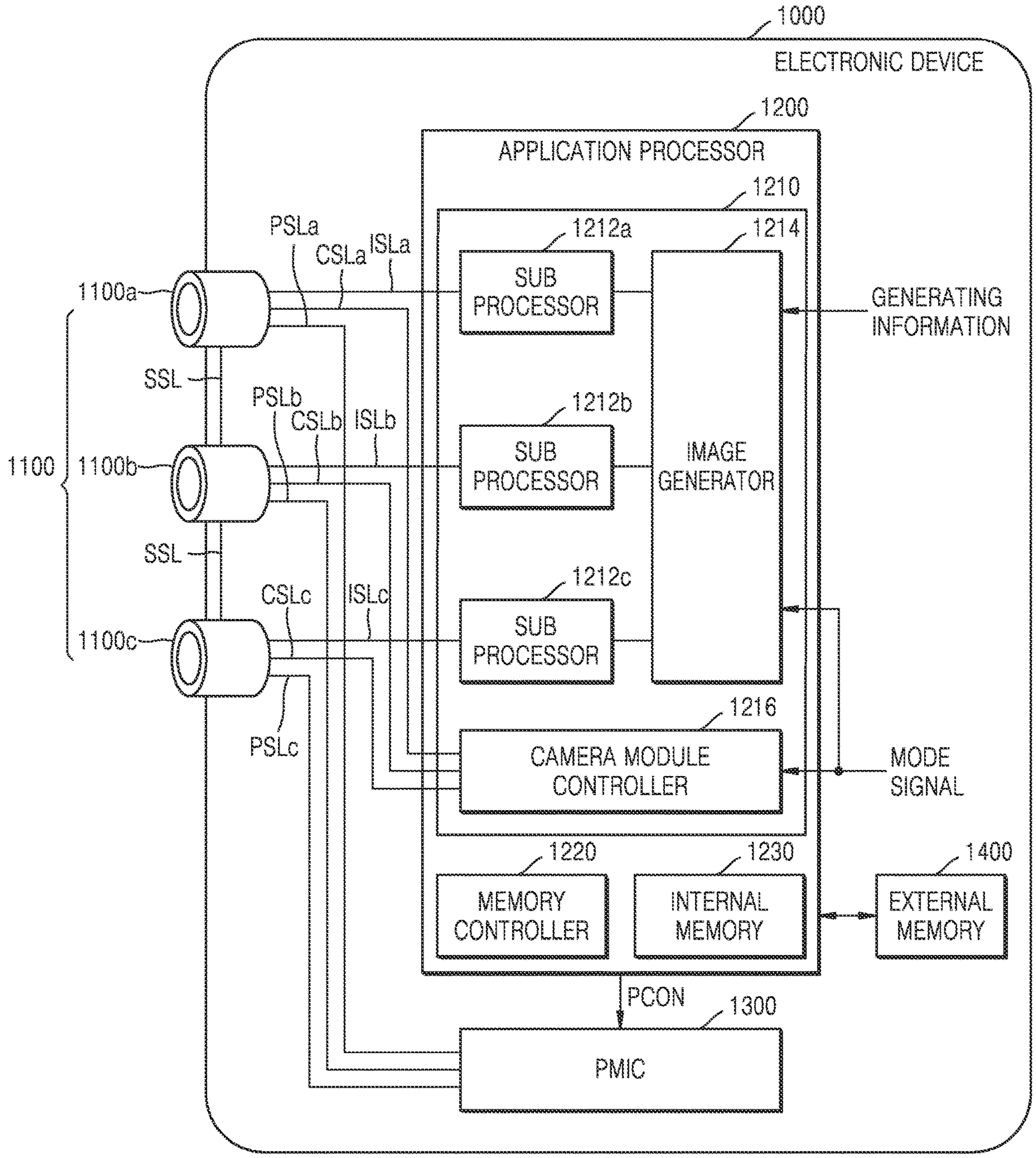
FIG. 10 is a block diagram of an electronic system according to an embodiment.
Figure 11:
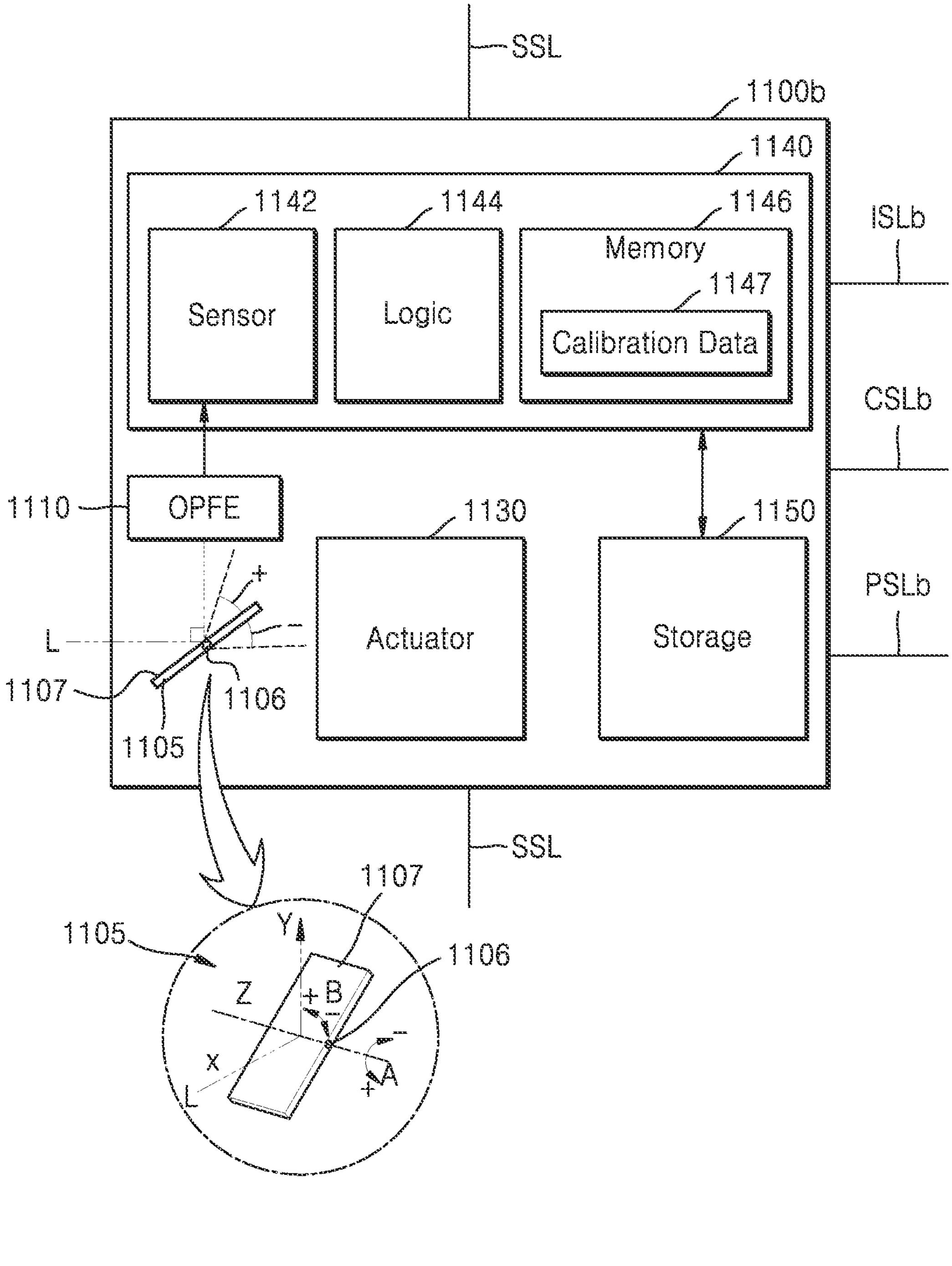
FIG. 11 is a detailed block diagram of a camera module included in the electronic system of FIG. 10.

FIG. 10 is a block diagram of an electronic system according to an embodiment, and FIG. 11 is a detailed block diagram of a camera module included in the electronic system of FIG. 10. Referring to FIG. 10, an electronic device 1000 may include a camera module group 1100, an application processor 1200, a power management integrated circuit (PMIC) 1300, and an external memory 1400.

The camera module group 1100 may include a plurality of camera modules 1100*a*, 1100*b*, and 1100*c*. Although the drawing shows an embodiment in which three camera modules 1100*a*, 1100*b*, and 1100*c* are disposed, the technical idea of the inventive concept is not limited thereto. In some embodiments, the camera module group 1100 may be modified to include only two camera modules. Also, in some embodiments, the camera module group 1100 may be modified to include n camera modules (where n is a natural number equal to or greater than 4).

Hereinafter, a detailed configuration of the camera module 1100*b* will be described in more detail with reference to FIG. 11, but the following description may be equally applied to other camera modules 1100*a* and 1100*c* according to embodiments.

Referring to FIG. 11, the camera module 1100*b* may include a prism 1105, an optical path folding element (OPFE) 1110, an actuator 1130, an image sensing device 1140, and a storage 1150. The prism 1105 may include a reflective surface 1107 of a light reflective material to change a path of light L incident from the outside.

In some embodiments, the prism 1105 may change the path of light L incident in a first direction (X direction in FIG. 11) to a second direction (Y direction in FIG. 11) perpendicular to the first direction. In addition, the prism 1105 may be rotated in the A direction around the central axis 1106 of the reflective surface 1107 of the light reflective material, or may rotate the central axis 1106 in the B direction to change the path of the light L incident in the first direction (X direction) to a second vertical direction (Y direction). At this time, the OPFE 1110 may also move in a third direction (Z direction in FIG. 11) perpendicular to the first direction (X direction) and the second direction (Y direction).

In some embodiments, as shown in FIG. 11, the maximum rotation angle of the prism 1105 in the A direction is 15 degrees or less in the plus (+) A direction and may be greater than 15 degrees in the minus (−) A direction, but the technical spirit of the inventive concept is not limited thereto. In some embodiments, the prism 1105 may move around 20 degrees, or between 10 degrees and 20 degrees, or between 15 degrees and 20 degrees in the plus (+) or minus (−) B direction, and here, the moving angle may move at the same angle in the plus (+) or minus (−) B direction, or may move at an almost similar angle within a range of about 1 degree.

In some embodiments, the prism 1105 may move the reflective surface 1107 of the light reflecting material in a third direction (e.g., the Z direction) parallel to the extension direction of the central axis 1106. The OPFE 1110 may include, for example, optical lenses consisting of m (where m is a natural number greater than 0) groups. The m lenses may move in the second direction (Y direction) to change the optical zoom ratio of the camera module 1100*b*. For example, when the basic optical zoom ratio of the camera module 1100*b* is Z, in the case of moving m optical lenses included in the OPFE 1110, the optical zoom ratio of the camera module 1100*b* may be changed to an optical zoom ratio of 3Z or 5Z or higher.

The actuator 1130 may move the OPFE 1110 or an optical lens to a certain position. For example, the actuator 1130 may adjust the position of the optical lens so that the image sensor 1142 is positioned at the focal length of the optical lens for accurate sensing.

The image sensing device 1140 may include an image sensor 1142, a control logic 1144, and a memory 1146. The image sensor 1142 may sense an image of a sensing target using light L provided through an optical lens. The control logic 1144 may control the overall operation of the camera module 1100*b*. For example, the control logic 1144 may control the operation of the camera module 1100*b* according to a control signal provided through the control signal line CSLb.

The memory 1146 may store information required for operation of the camera module 1100*b*, such as calibration data 1147. The calibration data 1147 may include information necessary for the camera module 1100*b* to generate image data using light L provided from the outside. The calibration data 1147 may include, for example, information about a degree of rotation, information about a focal length, information about an optical axis, and the like, as described above. When the camera module 1100*b* is implemented in the form of a multi-state camera in which the focal length changes according to the position of the optical lens, the calibration data 1147 may include a focal length value for each position (or state) of the optical lens and information related to auto focusing.

The storage 1150 may store image data sensed through the image sensor 1142. The storage 1150 may be disposed outside the image sensing device 1140 and may be implemented in a stacked form with a sensor chip constituting the image sensing device 1140. In some embodiments, the storage unit 1150 may be implemented as an electrically erasable programmable read-only memory (EEPROM), but the technical spirit of the inventive concept is not limited thereto. The image sensor 1142 may include any one of the image sensors 100, 200 and 300 described with reference to FIGS. 1 to 9, or may include variously modified and changed image sensors within the scope of the technical idea of the inventive concept.

Referring to FIGS. 10 and 11, in some embodiments, each of the plurality of camera modules 1100*a*, 1100*b*, and 1100*c* may include an actuator 1130. Accordingly, each of the plurality of camera modules 1100*a*, 1100*b*, and 1100*c* may include the same or different calibration data 1147 according to the operation of the actuator 1130 included therein.

In some embodiments, one (e.g., 1100*b*) of the plurality of camera modules 1100*a*, 1100*b*, and 1100*c* is a camera module in the form of a folded lens including the prism 1105 and the OPFE 1110 described above, and the remaining camera modules (e.g., 1100*a* and 1100*c*) may be vertical camera modules that do not include the prism 1105 and the OPFE 1110, but the technical idea of the inventive concept is not limited thereto. In some embodiments, one camera module (e.g., 1100*c*) of the plurality of camera modules 1100*a*, 1100*b*, and 1100*c*, for example, may be a vertical type depth camera that extracts depth information using Infrared Ray (IR). In this case, the application processor 1200 merges image data provided from the depth camera with image data provided from another camera module (e.g., 1100*a* or 1100*b*) to generate a 3D depth image.

In some embodiments, at least two camera modules (e.g., 1100*a* and 1100*b*) among the plurality of camera modules 1100*a*, 1100*b*, and 1100*c* may have different fields of view. In this case, for example, optical lenses of at least two camera modules (e.g., 1100*a* and 1100*b*) among the plurality of camera modules 1100*a*, 1100*b*, and 1100*c* may be different from each other, but the inventive concept is not limited thereto.

Also, in some embodiments, the fields of view of each of the plurality of camera modules 1100*a*, 1100*b*, and 1100*c* may be different from each other. In this case, optical lenses included in each of the plurality of camera modules 1100*a*, 1100*b*, and 1100*c* may also be different from each other, but are not limited thereto. In some other embodiments, each of the plurality of camera modules 1100*a*, 1100*b*, and 1100*c* may be disposed physically separated from each other. That is, the sensing area of one image sensor 1142 is not divided and used by a plurality of camera modules 1100*a*, 1100*b*, and 1100*c*, but an independent image sensor 1142 may be disposed inside each of the plurality of camera modules 1100*a*, 1100*b*, and 1100*c*.

Referring FIG. 10 again, the application processor 1200 may include an image processing device 1210, a memory controller 1220, and an internal memory 1230. The application processor 1200 may be implemented separately from the plurality of camera modules 1100*a*, 1100*b*, and 1100*c*. For example, the application processor 1200 and the plurality of camera modules 1100*a*, 1100*b*, and 1100*c* may be separately implemented as separate semiconductor chips.

The image processing device 1210 may include a plurality of sub processors 1212*a*, 1212*b*, and 1212*c*, an image generator 1214, and a camera module controller 1216. The image processing device 1210 may include the number of sub processors 1212*a*, 1212*b*, and 1212*c* corresponding to the number of the plurality of camera modules 1100*a*, 1100*b*, and 1100*c*.

Image data generated from each of the camera modules 1100*a*, 1100*b*, and 1100*c* may be provided to corresponding sub processors 1212*a*, 1212*b*, and 1212*c* through image signal lines ISLa, ISLb, and ISLc separated from each other. For example, image data generated from the camera module 1100*a* may be provided to the sub processor 1212*a* through the image signal line ISLa, image data generated from the camera module 1100*b* may be provided to the sub processor 1212*b* through the image signal line ISLb, and image data generated by the camera module 1100*c* may be provided to the sub processor 1212*c* through the image signal line ISLc. Such image data transmission may be performed using, for example, a Camera Serial Interface (CSI) based on Mobile Industry Processor Interface (MIPI), but the technical idea of the inventive concept is not limited thereto.

Meanwhile, in some embodiments, one sub processor may be arranged to correspond to a plurality of camera modules. For example, the sub processor 1212*a* and the sub processor 1212*c* are not implemented separately from each other as shown, but integrated into one sub processor, and image data provided from the camera modules 1100*a* and 1100*c* may be selected through a selection element (e.g., a multiplexer) and then provided to the integrated sub processor.

Image data provided to each of the sub processors 1212*a*, 1212*b*, and 1212*c* may be provided to the image generator 1214. The image generator 1214 may generate an output image using image data provided from each of the sub processors 1212*a*, 1212*b*, and 1212*c* according to image generating information or a mode signal. Specifically, the image generator 1214 may generate an output image by merging at least some of image data generated from the plurality of camera modules 1100*a*, 1100*b*, and 1100*c* having different fields of view, according to the image generation information or mode signal. Also, the image generator 1214 may generate an output image by selecting any one of image data generated from the camera modules 1100*a*, 1100*b*, and 1100*c* having different viewing angles, according to the image generation information or mode signal.

In some embodiments, the image creation information may include a zoom signal or zoom factor. Also, in some embodiments, the mode signal may be a signal based on a mode selected by a user, for example. When the image generation information is a zoom signal (zoom factor) and each of the camera modules 1100*a*, 1100*b*, and 1100*c* has different fields of view (viewing angles), the image generator 1214 may perform different operations according to the type of zoom signal. For example, when the zoom signal is the first signal, after merging the image data output from the camera module 1100*a* and the image data output from the camera module 1100*c*, an output image may be generated using the merged image signal and image data output from the camera module 1100*b* not used for merging. If the zoom signal is a second signal different from the first signal, the image generator 1214 may generate an output image by selecting any one of image data output from each of the plurality of camera modules 1100*a*, 1100*b*, and 1100*c* without merging the image data. However, the technical spirit of the inventive concept is not limited thereto, and a method of processing image data may be modified and implemented as needed.

In some embodiments, the image generator 1214 receives a plurality of image data having different exposure times from at least one of the plurality of sub processors 1212*a*, 1212*b*, and 1212*c*, and performs high dynamic range (HDR) processing on a plurality of image data to generate merged image data with an increased dynamic range.

The camera module controller 1216 may provide a control signal to each of the plurality of camera modules 1100*a*, 1100*b*, and 1100*c*. Control signals generated from the camera module controller 1216 may be provided to the corresponding plurality of camera modules 1100*a*, 1100*b*, and 1100*c* through separate control signal lines CSLa, CSLb, and CSLc.

Any one of the plurality of camera modules 1100*a*, 1100*b*, 1100*c*, for example, the camera module 1100*b* is designated as a master camera module according to image generation information including a zoom signal or a mode signal, and the remaining camera modules, for example, camera modules 1100*a* and 1100*c*, may be designated as slave cameras. Such information may be included in a control signal and provided to the corresponding plurality of camera modules 1100*a*, 1100*b*, and 1100*c* through separate control signal lines CSLa, CSLb, and CSLc.

Camera modules operating as a master and a slave may be changed according to a zoom factor or an operation mode signal. For example, when the field of view of the camera module 1100*a* is wider than the field of view of the camera module 1100*b* and the zoom factor indicates a low zoom magnification, the camera module 1100*b* may operate as a master and the camera module 1100*a* may operate as a slave. Conversely, when the zoom factor indicates a high zoom magnification, the camera module 1100*a* may operate as a master and the camera module 1100*b* may operate as a slave.

In some embodiments, a control signal provided from the camera module controller 1216 to each of the plurality of camera modules 1100*a*, 1100*b*, and 1100*c* may include a sync enable signal. For example, when the camera module 1100*b* is a master camera and the camera modules 1100*a* and 1100*c* are slave cameras, the camera module controller 1216 may transmit a sync enable signal to the camera module 1100*b*. The camera module 1100*b* receiving such a sync enable signal may generate a sync signal based on the sync enable signal provided, and provide the generated sync signal to the camera modules 1100*a* and 1100*c* through the sync signal line SSL. The camera module 1100*b* and the camera modules 1100*a* and 1100*c* may transmit image data to the application processor 1200 in synchronization with the sync signal.

In some embodiments, a control signal provided from the camera module controller 1216 to the plurality of camera modules 1100*a*, 1100*b*, and 1100*c* may include mode information according to the mode signal. Based on this mode information, the plurality of camera modules 1100*a*, 1100*b*, and 1100*c* may operate in a first operation mode and a second operation mode in relation to sensing speed.

The plurality of camera modules 1100*a*, 1100*b*, and 1100*c* may generate image signals at a first rate in a first operation mode (e.g., generate an image signal of the first frame rate) and encode the generated images at a second rate higher than the first rate (e.g., encode an image signal having a second frame rate higher than the first frame rate), and may transmit the encoded image signal to the application processor 1200. At this time, the second rate may be less than 30 times the first rate.

The application processor 1200 stores the received image signal, that is, the encoded image signal, in the internal memory 1230 or in the external memory 1400 external to the application processor 1200, and then may read and decode an image signal encoded from the internal memory 1230 or the external memory 1400, and display image data generated based on the decoded image signal. For example, a corresponding sub processor among the plurality of sub processors 1212*a*, 1212*b*, and 1212*c* of the image processing device 1210 may perform decoding and image processing on the encoded image signal.

In the second operation mode, the plurality of camera modules 1100*a*, 1100*b*, and 1100*c* may generate image signals at a third rate lower than the first rate (e.g., generate image signals of a third frame rate lower than the first frame rate), and transmit image signals to the application processor 1200. An image signal provided to the application processor 1200 may be an unencoded signal. The application processor 1200 may perform image processing on a received image signal or store the image signal in the internal memory 1230 or the external memory 1400.

The PMIC 1300 may supply power, for example, a power supply voltage, to each of the plurality of camera modules 1100*a*, 1100*b*, and 1100*c*. For example, the PMIC 1300 may supply first power to the camera module 1100*a* through a power signal line PSLa under the control of the application processor 1200, and supply second power to the camera module 1100*b* through the power signal line PSLb and third power to the camera module 1100*c* through the power signal line PSLc.

The PMIC 1300 may generate power corresponding to each of the plurality of camera modules 1100*a*, 1100*b*, and 1100*c* in response to a power control signal PCON from the application processor 1200, and may also adjust the level of the power. The power control signal PCON may include a power control signal for each operation mode of the plurality of camera modules 1100*a*, 1100*b*, and 1100*c*. For example, the operation mode may include a low power mode, and in this case, the power control signal PCON may include information about a camera module operating in the low power mode and a set power level. Levels of the powers provided to each of the plurality of camera modules 1100*a*, 1100*b*, and 1100*c* may be the same or different from each other. Also, the level of power may be dynamically changed.

FIGS. 12A to 20B are cross-sectional views illustrating a manufacturing method of an image sensor according to an embodiment according to a process sequence, FIGS. 12A, 13A, 14A, 15A, 16A, 17A, 18, 19, and 20A are cross-sectional views of parts corresponding to the line I-I' of FIG. 3A according to the process sequence, and FIGS. 12B, 13B, 14B, 15B, 16B, 17B, and 20B are cross-sectional views of parts corresponding to the line II-II' of FIG. 3A according to the process order. An exemplary manufacturing method of the image sensor 100 illustrated in FIGS. 3A to 3E will be described with reference to FIGS. 12A to 20B.

Figure 12A:
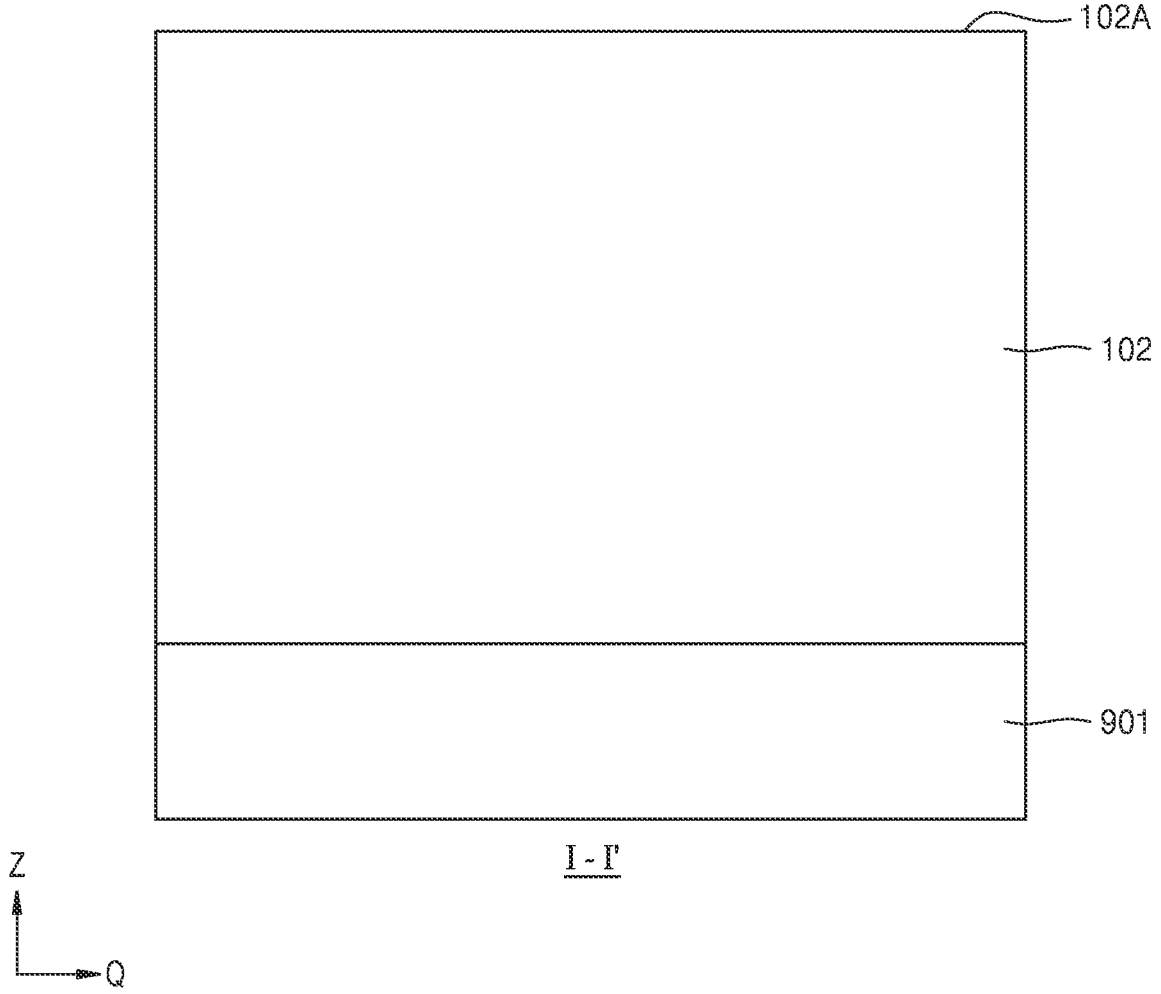
FIGS. 12A to 20B are cross-sectional views illustrating a manufacturing method of an image sensor according to an embodiment according to a process sequence.
Figure 12B:
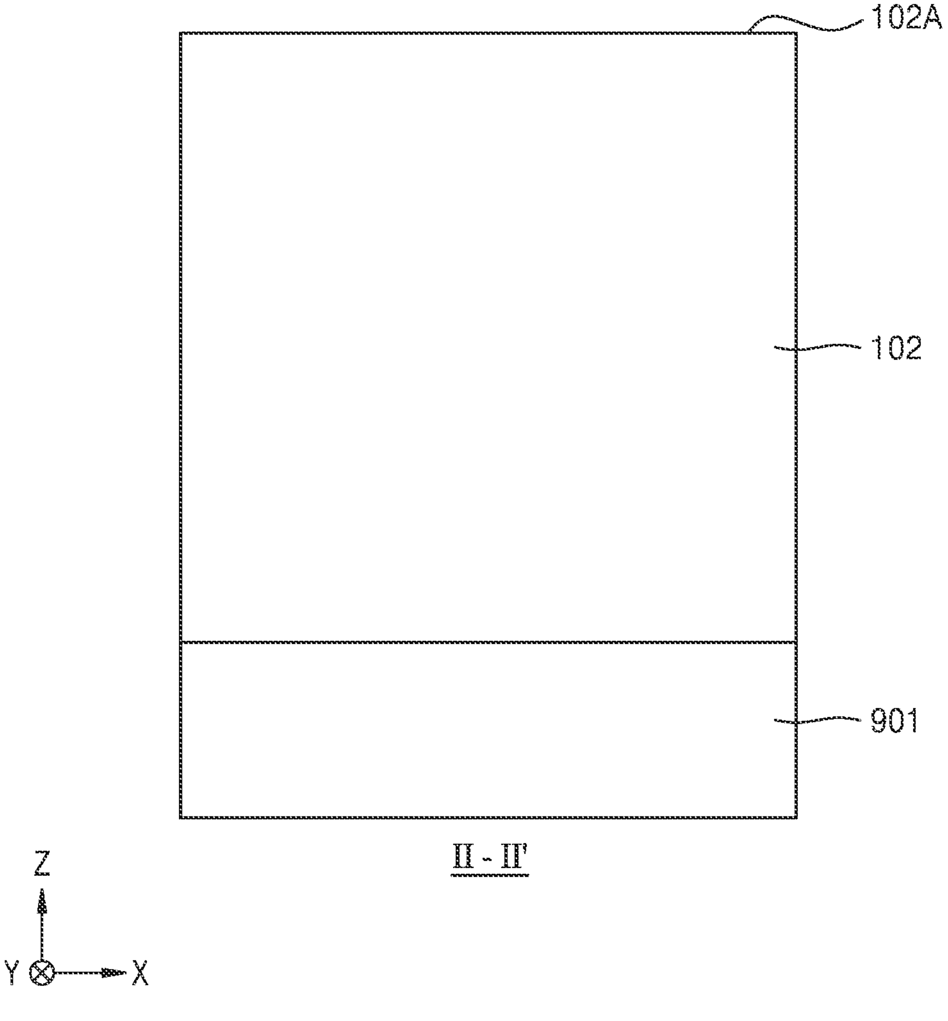

Referring to FIGS. 12A and 12B, a substrate 102 made of an epitaxial semiconductor layer may be formed on a silicon substrate 901. In some embodiments, the silicon substrate 901 may be made of single crystal silicon. The substrate 102 may be made of a single crystal silicon film epitaxially grown from the surface of the silicon substrate 901. In example embodiments, the silicon substrate 901 and the substrate 102 may be formed of a single crystal silicon film doped with boron (B) ions. After the substrate 102 is formed, a first surface 102A of the substrate 102 may be exposed.

Figure 13A:
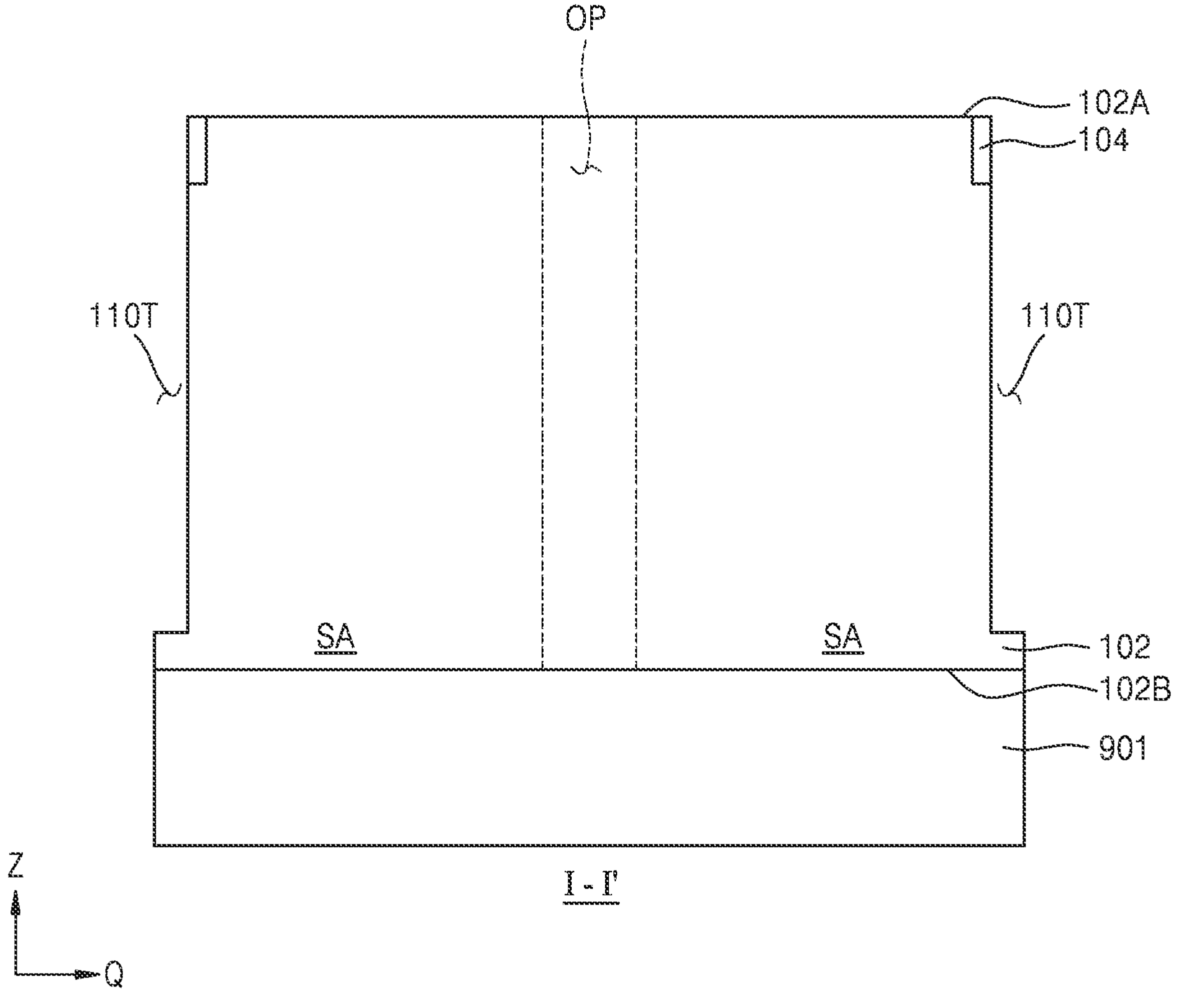
Figure 13B:
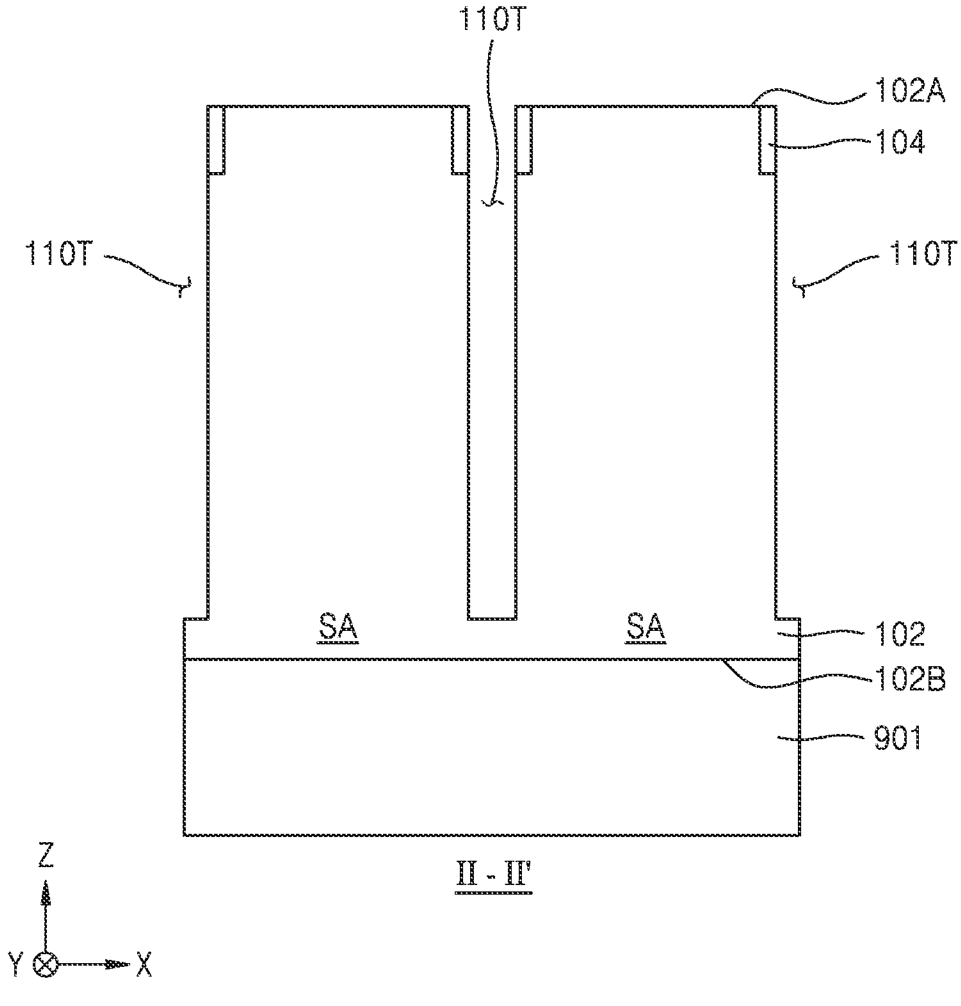

Referring to FIGS. 13A and 13B, in the results of FIGS. 12A and 12B, after partially etching the substrate 102 from the first surface 102A of the substrate 102 to form a plurality of shallow trenches (not shown), a local separation film 104 filling the plurality of shallow trenches may be formed. After that, a plurality of first trenches 110T penetrating the local separation film 104 and a portion of the substrate 102 may be formed. A portion of each of the plurality of sensing areas SA may be defined by the plurality of first trenches 110T. Each of the plurality of first trenches 110T may be formed to extend in a direction perpendicular to the first surface 102A.

After the plurality of first trenches 110T are formed, the substrate 102 may include an opening area OP having a relatively narrow width defined by the plurality of first trenches 110T. After the plurality of first trenches 110T are formed, among the plurality of sensing areas SA, at least two sensing areas SA adjacent to each other may remain interconnected by an opening area OP of the substrate 102 in which the plurality of first trenches 110T are not formed.

Figure 14A:
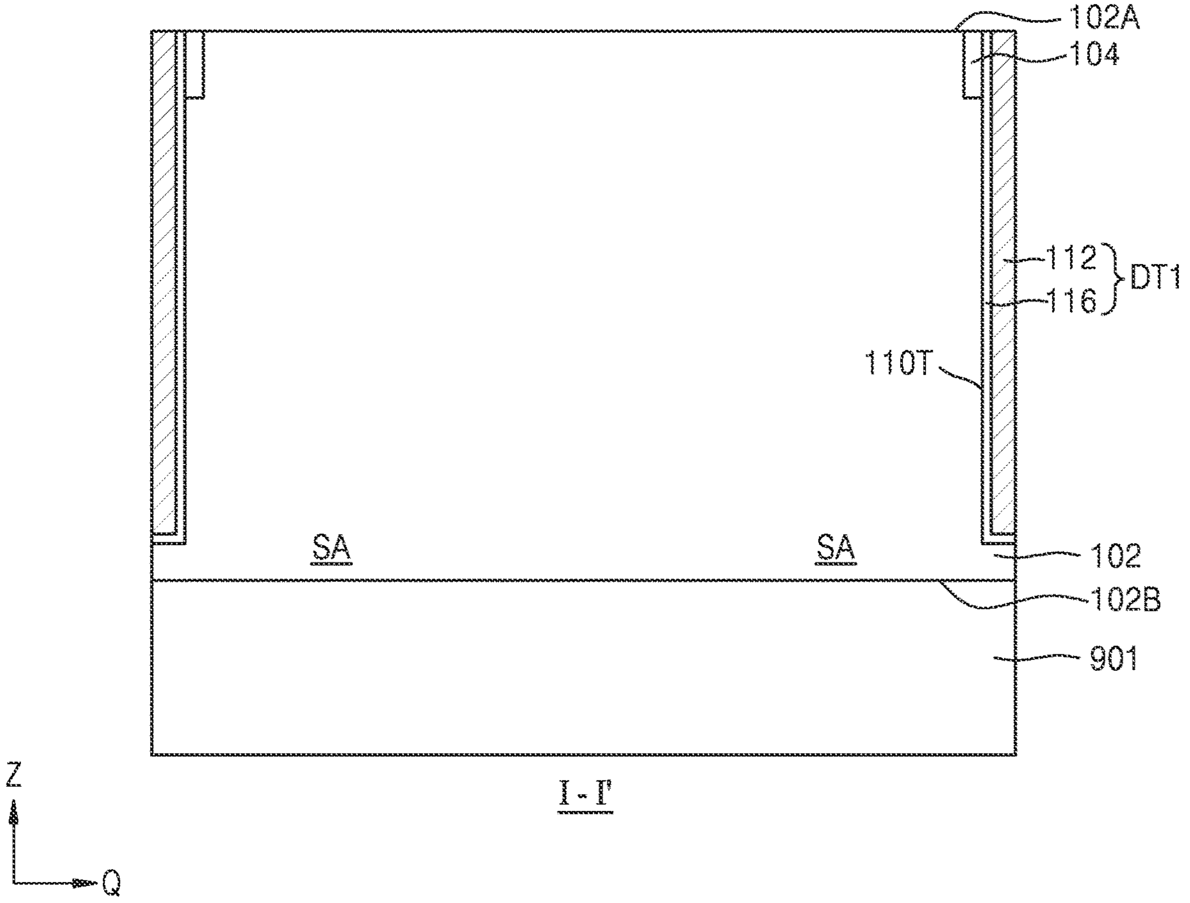
Figure 14B:
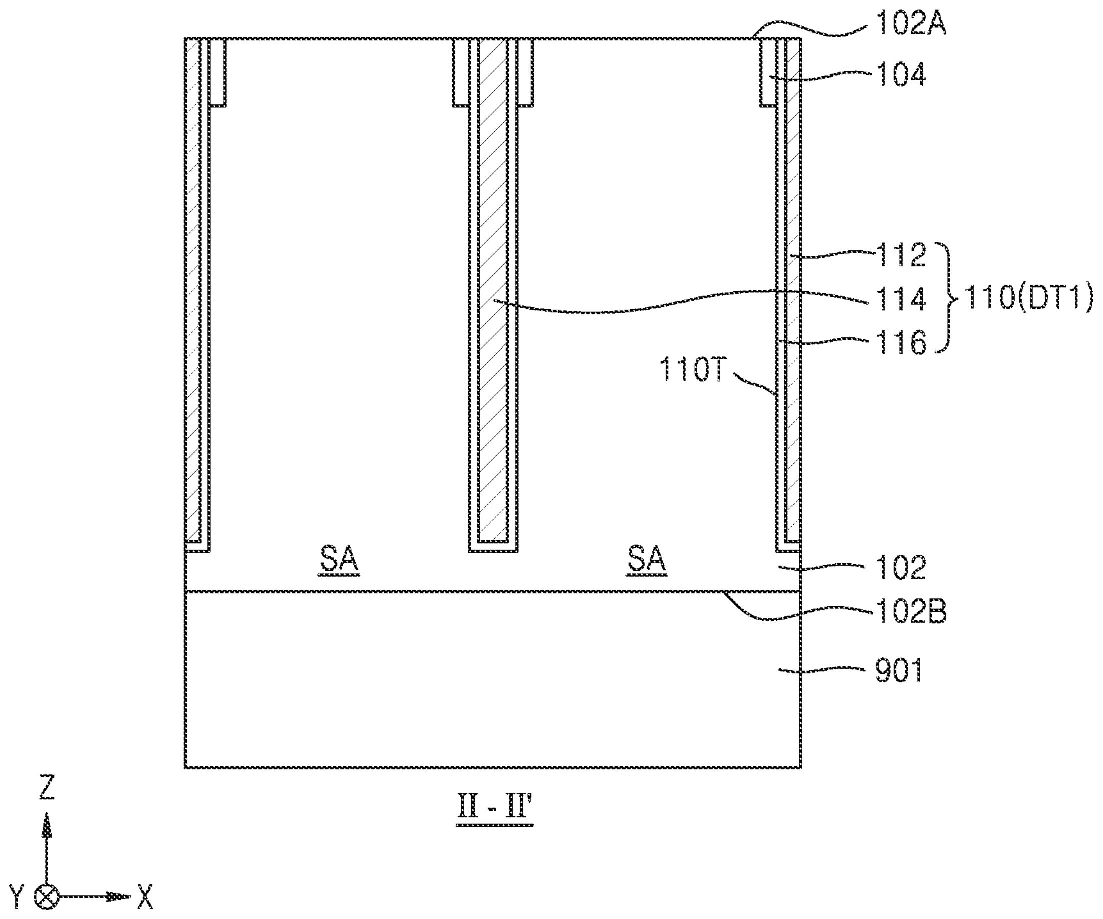

Referring to FIGS. 14A and 14B, in the results of FIGS. 13A and 13B, an outer separation film 112, an inner separation film 114, and a first liner 116 may be formed inside the first trench 110T. A first liner 116 may be formed on the exposed surface of the first trench 110T, and an outer separation film 112 and/or an inner separation film 114 filling the inner space of the first trench 110T may be formed on the first liner 116.

Figure 15A:
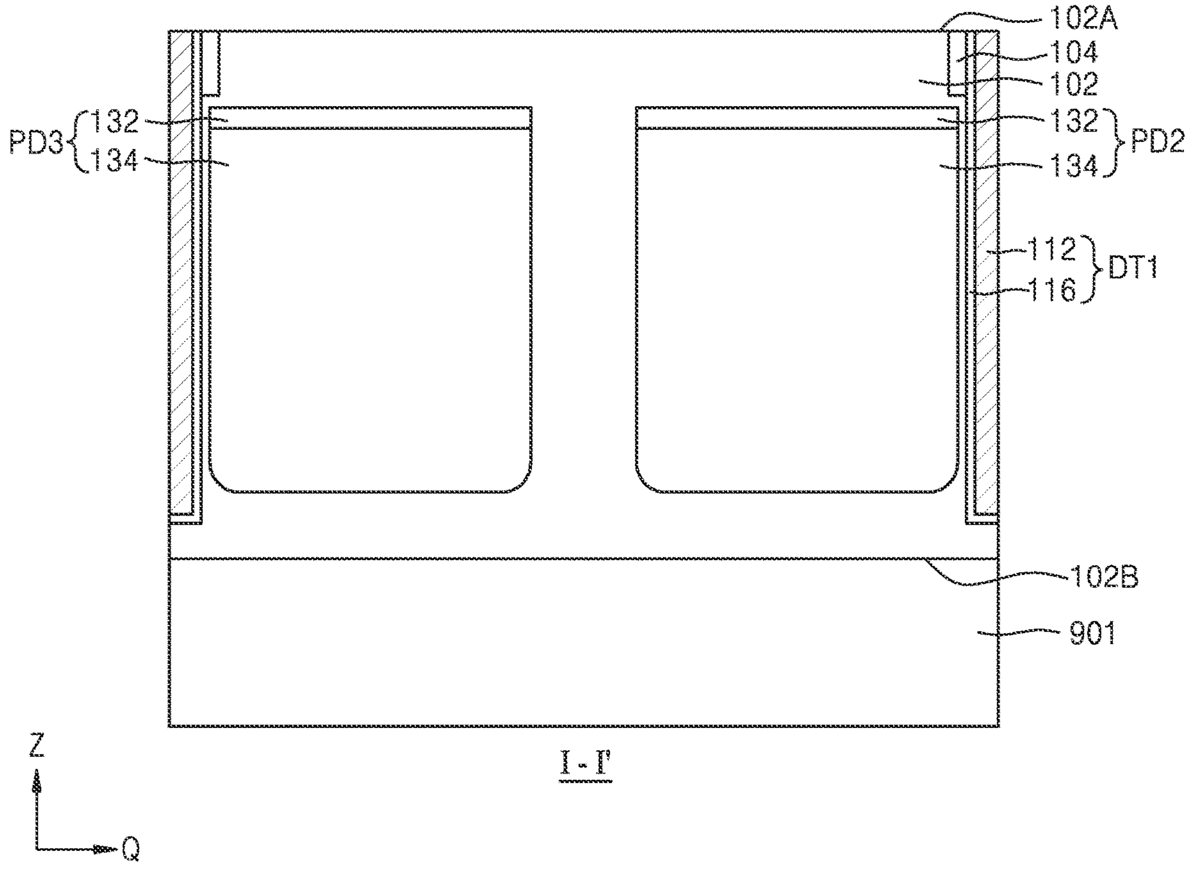
Figure 15B:
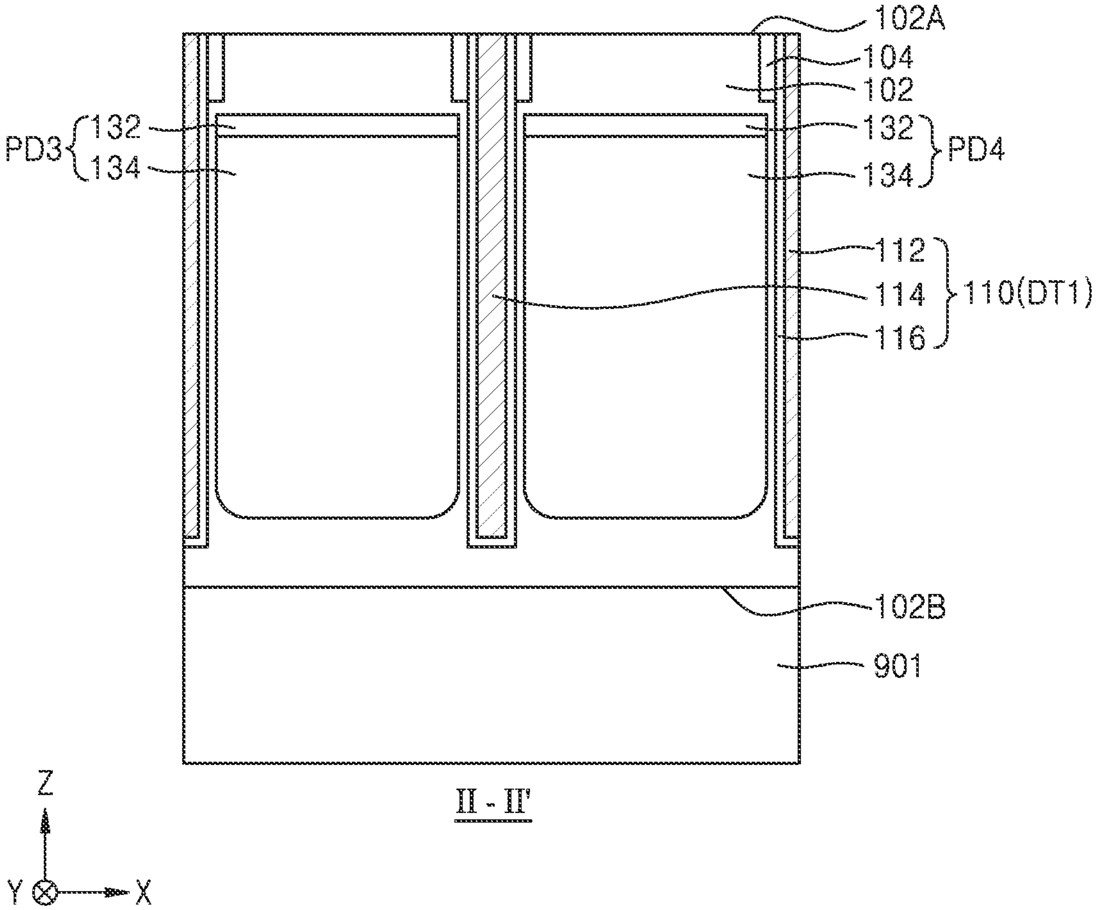

Referring to FIGS. 15A and 15B, in the results of FIGS. 14A and 14B, first to fourth photodiodes PD1, PD2, PD3, and PD4 (see FIG. 3A) may be formed in the sensing area SA (see FIGS. 14A and 14B) from the first surface 102A of the substrate 102 by an ion implantation process. In embodiments, to form the first to fourth photodiodes PD1, PD2, PD3, and PD4, ion implantation processes may be performed to form the plurality of first semiconductor regions 132 and the plurality of second semiconductor regions 134.

Figure 16A:
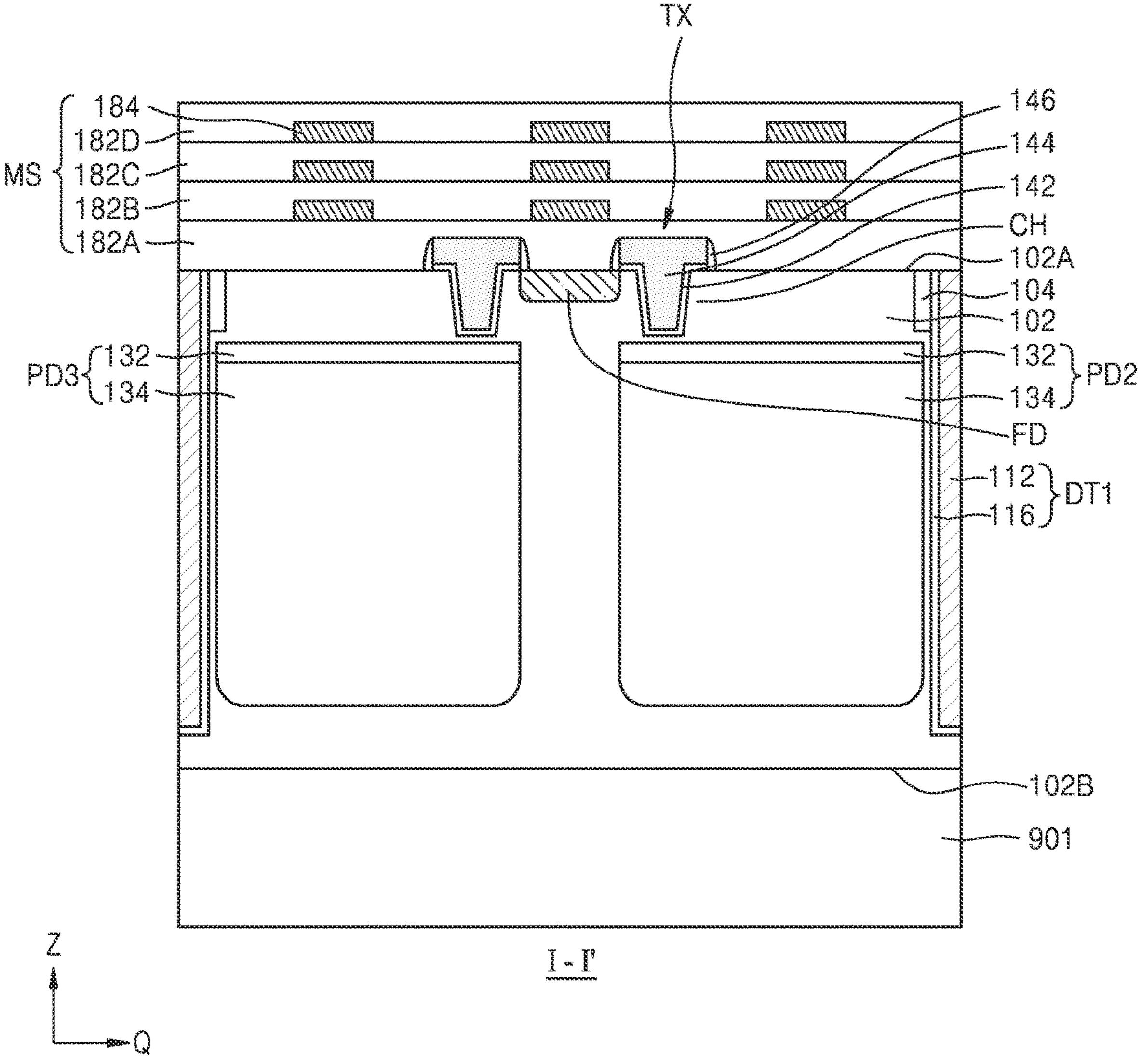
Figure 16B:
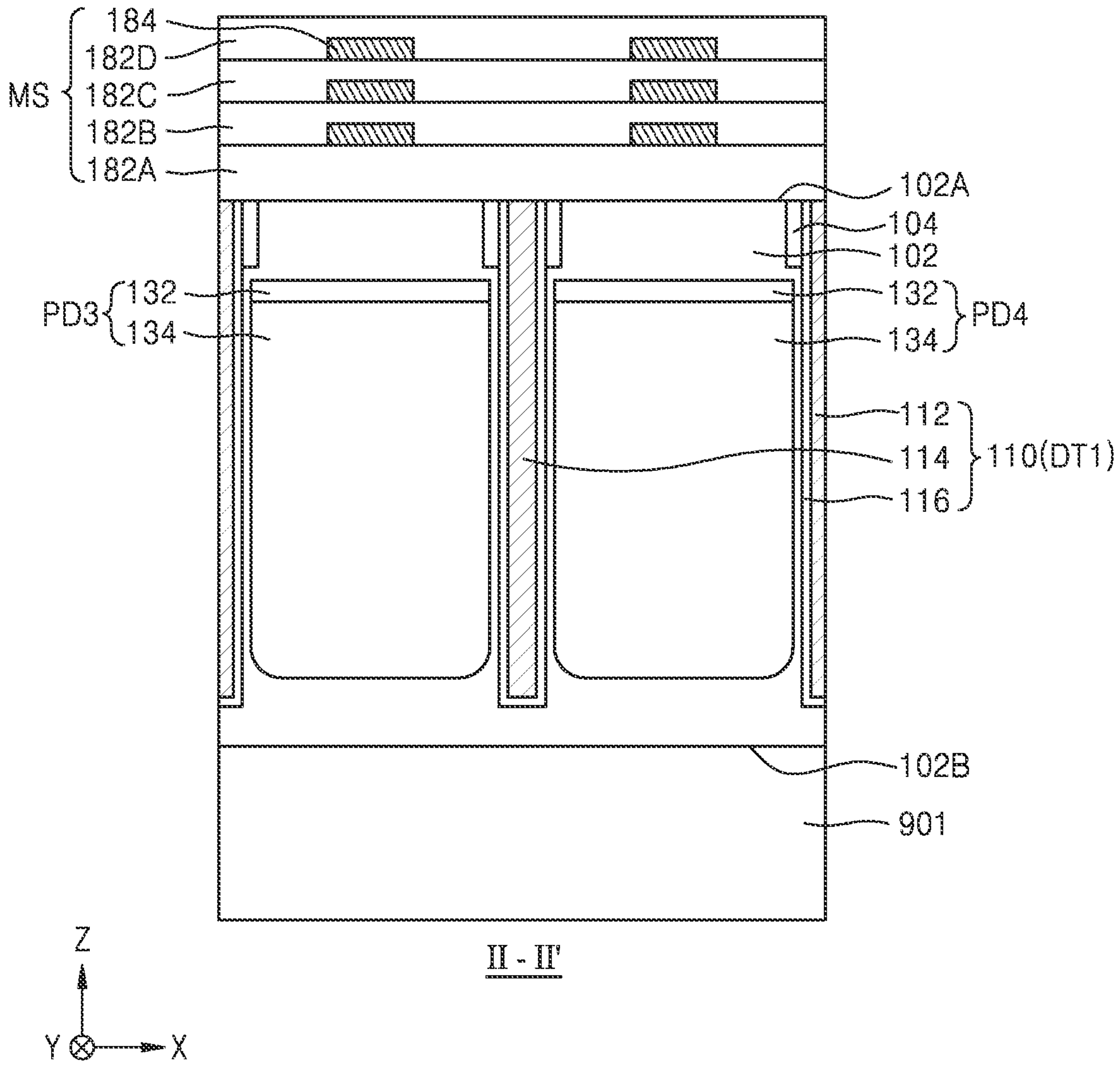

Referring to FIGS. 16A and 16B, in the results of FIGS. 15A and 15B, a plurality of gate structures including a gate dielectric film 142 and a transfer gate 144 may be formed on the first surface 102A of the substrate 102, and a floating diffusion region FD may be formed by implanting impurity ions into a partial region of the substrate 102 from the first surface 102A of the substrate 102. A channel region CH may be formed in the substrate 102, and an insulating spacer 146 may be formed to cover sidewalls of each of the gate dielectric film 142 and the transfer gate 144 on the first surface 102A of the substrate 102. The plurality of gate structures may include gate structures configuring transistors (e.g., transfer transistors TX) necessary to drive the plurality of subpixels SP1 included in the image sensor 100 described with reference to FIGS. 2 to 3E. Then, a wiring structure MS including first to fourth interlayer insulating films 182A, 182B, 182C, and 182D having a multi-layer structure and a plurality of wiring layers 184 may be formed on the plurality of gate structures.

In this example, only a partial area of the color unit pixel CP1 of the substrate 102 is illustrated, but the substrate 102 may further include a plurality of pixel groups PG described with reference to FIG. 1, and a peripheral circuit area (not shown) and a pad area (not shown) disposed around the plurality of pixel groups PG. The peripheral circuit area may be an area including various types of circuits for controlling a plurality of pixel groups PG. For example, the peripheral circuit area may include a plurality of transistors. The plurality of transistors may provide a constant signal to each of the first to fourth photodiodes PD1, PD2, PD3, and PD4, or may be driven to control an output signal of each of the first to fourth photodiodes PD1, PD2, PD3, and PD4. For example, the plurality of transistors may configure various types of logic circuits, such as a timing generator, a row decoder, a row driver, a correlated double sampler (CDS), an analog to digital converter (ADC), a latch, column decoder, and the like. The pad area may include a conductive pad electrically connected to a plurality of pixel groups PG and a circuit in the peripheral circuit area. The conductive pad may function as a connection terminal providing power and signals from the outside to a plurality of pixel units and a circuit in the peripheral circuit area.

Figure 17A:
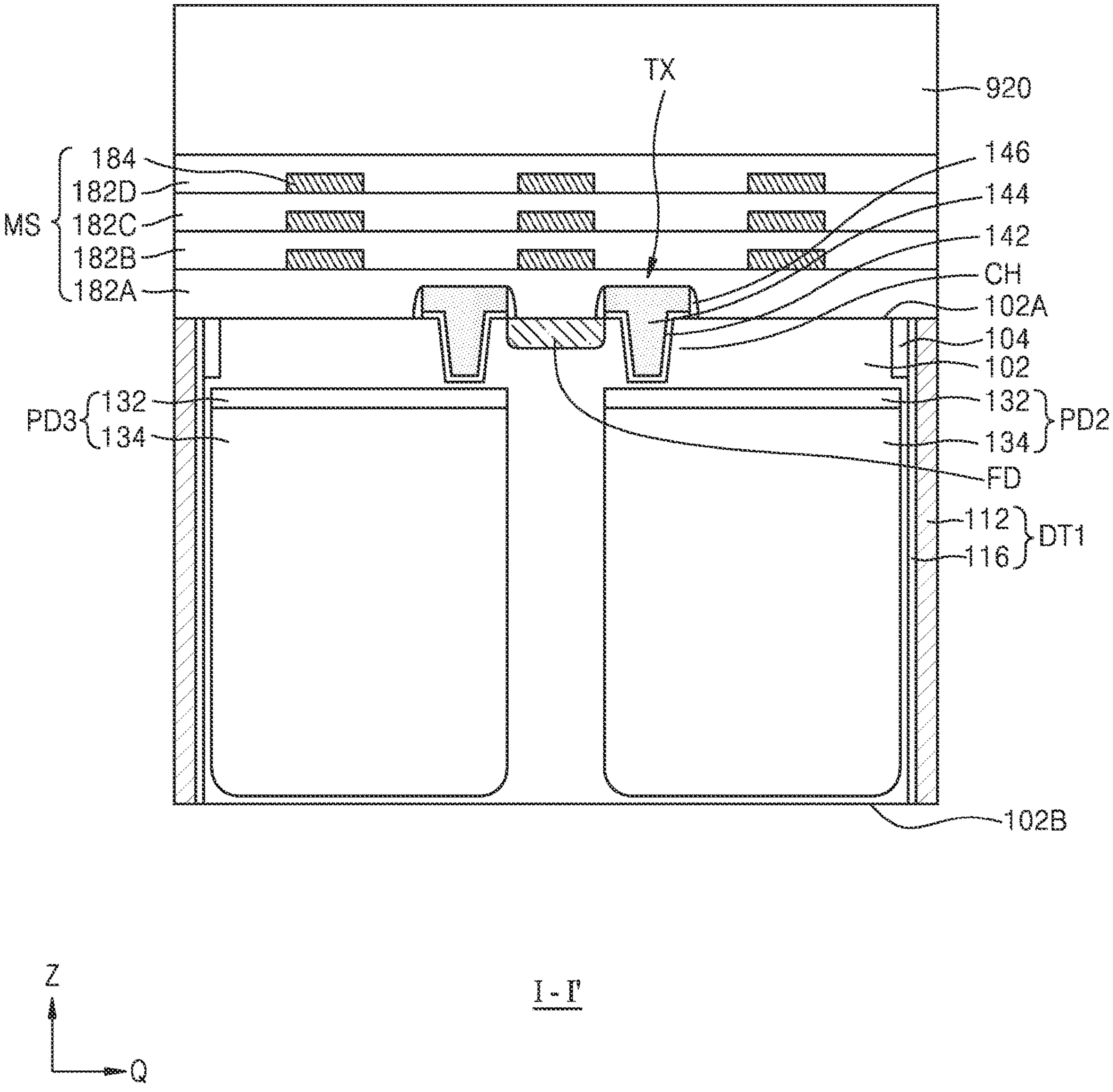
Figure 17B:
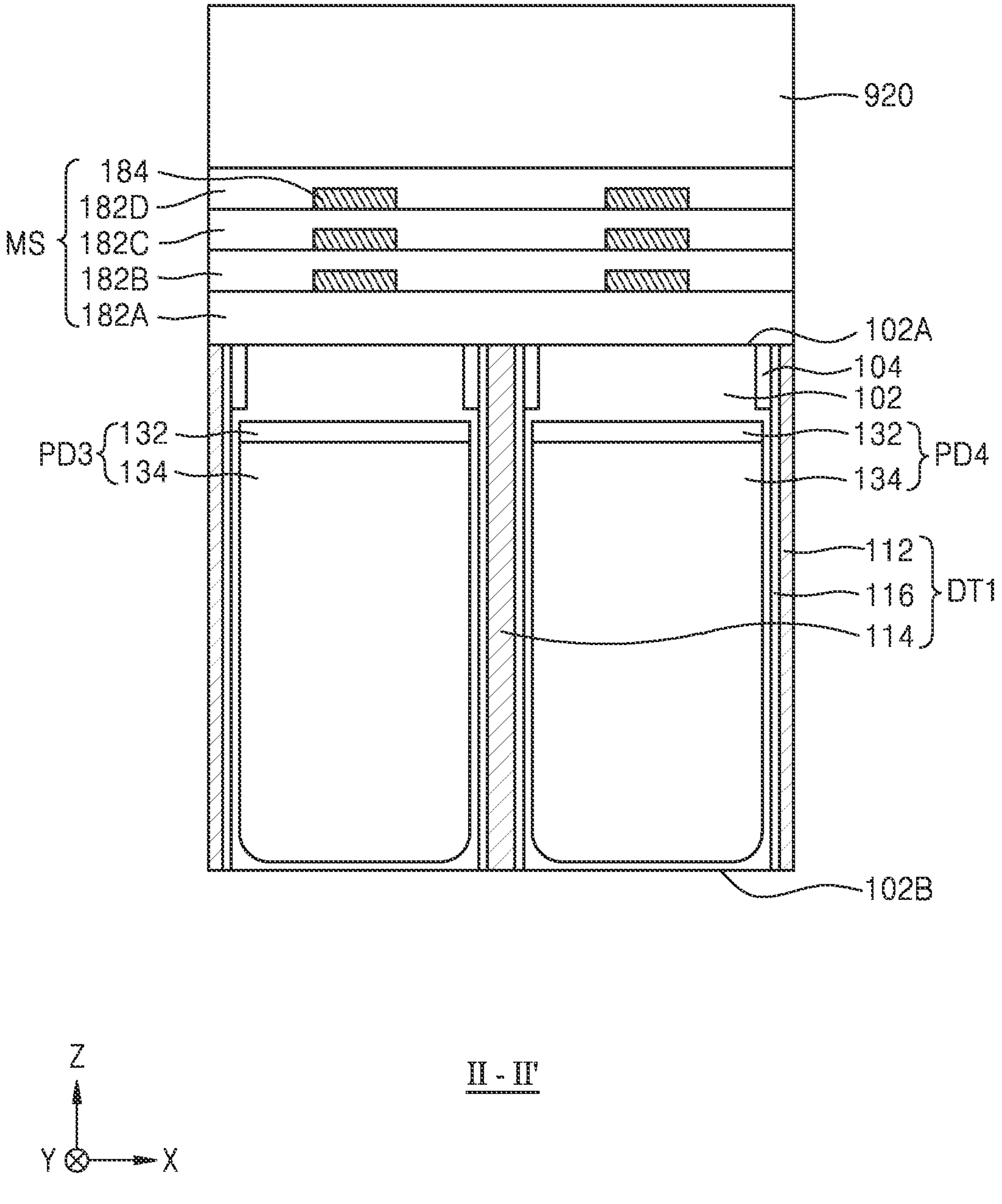

Referring to FIGS. 17A and 17B, in the results of FIGS. 16A and 16B, a support substrate 920 may be attached on the wiring structure MS. An adhesive layer (not shown) may be disposed between the support substrate 920 and the fourth interlayer insulating film 182D. After that, in a state where the support substrate 920 is adhered on the wiring structure MS, by removing the silicon substrate 901 (see FIGS. 16A and 16B), a portion of the substrate 102, and a portion of the first liner 116 by using a mechanical grinding process, a chemical mechanical polishing (CMP) process, a wet etching process, or combinations thereof, so that the second surface 102B of the substrate 102, the bottom surface of the outer separation film 112, the bottom surface of the plurality of inner separation films 114, and the bottom surface of the first liner 116 may be exposed.

Figure 18:
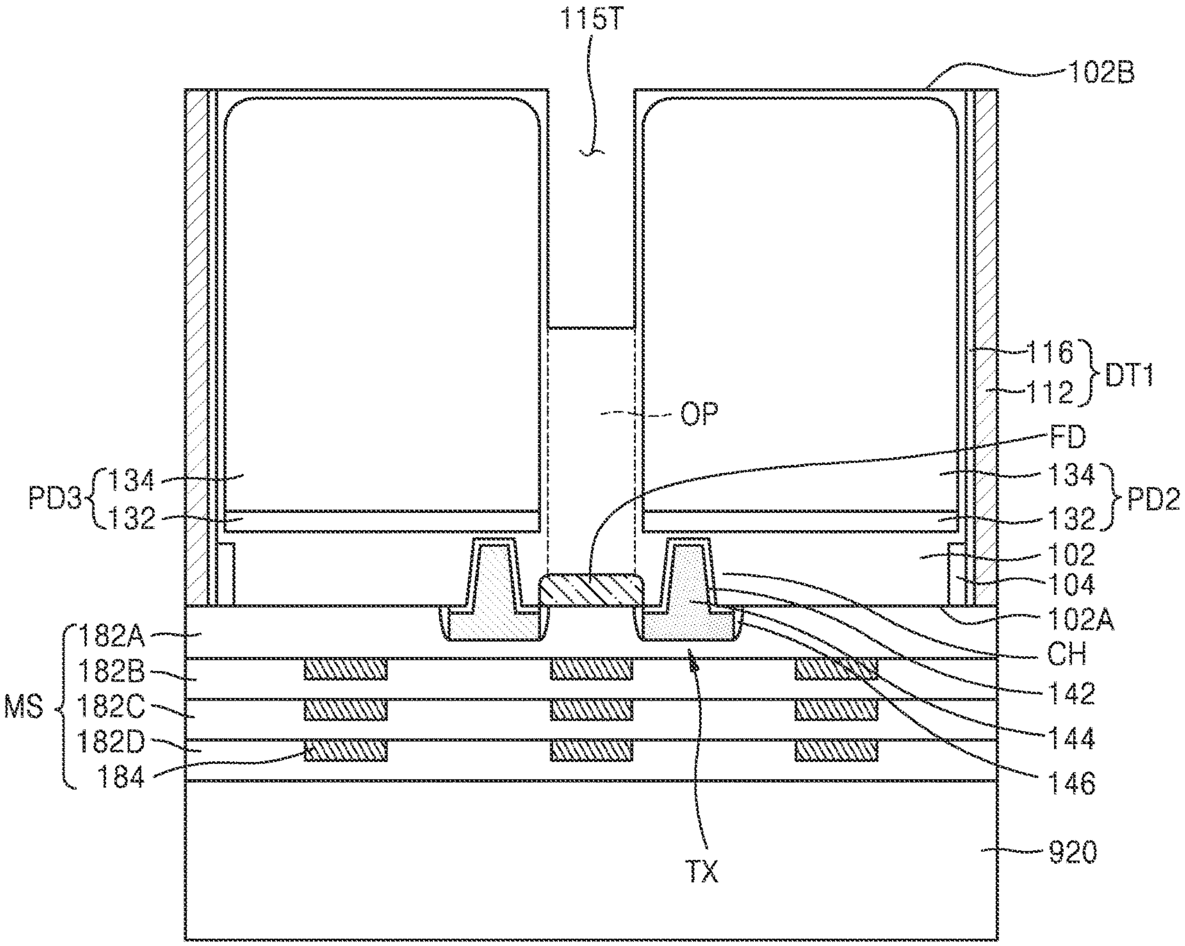

Referring to FIG. 18, in the results of FIGS. 17A and 17B, the first surface 102A and the second surface 102B of the substrate 102 may be reversed. The substrate 102 may be partially etched from the second surface 102B to form the second trench 115T. The second trench 115T may be formed to extend in a direction perpendicular to the second surface 102B. The second trench 115T may overlap each of the opening area OP and/or the floating diffusion region FD in a vertical direction (Z direction).

Figure 19:
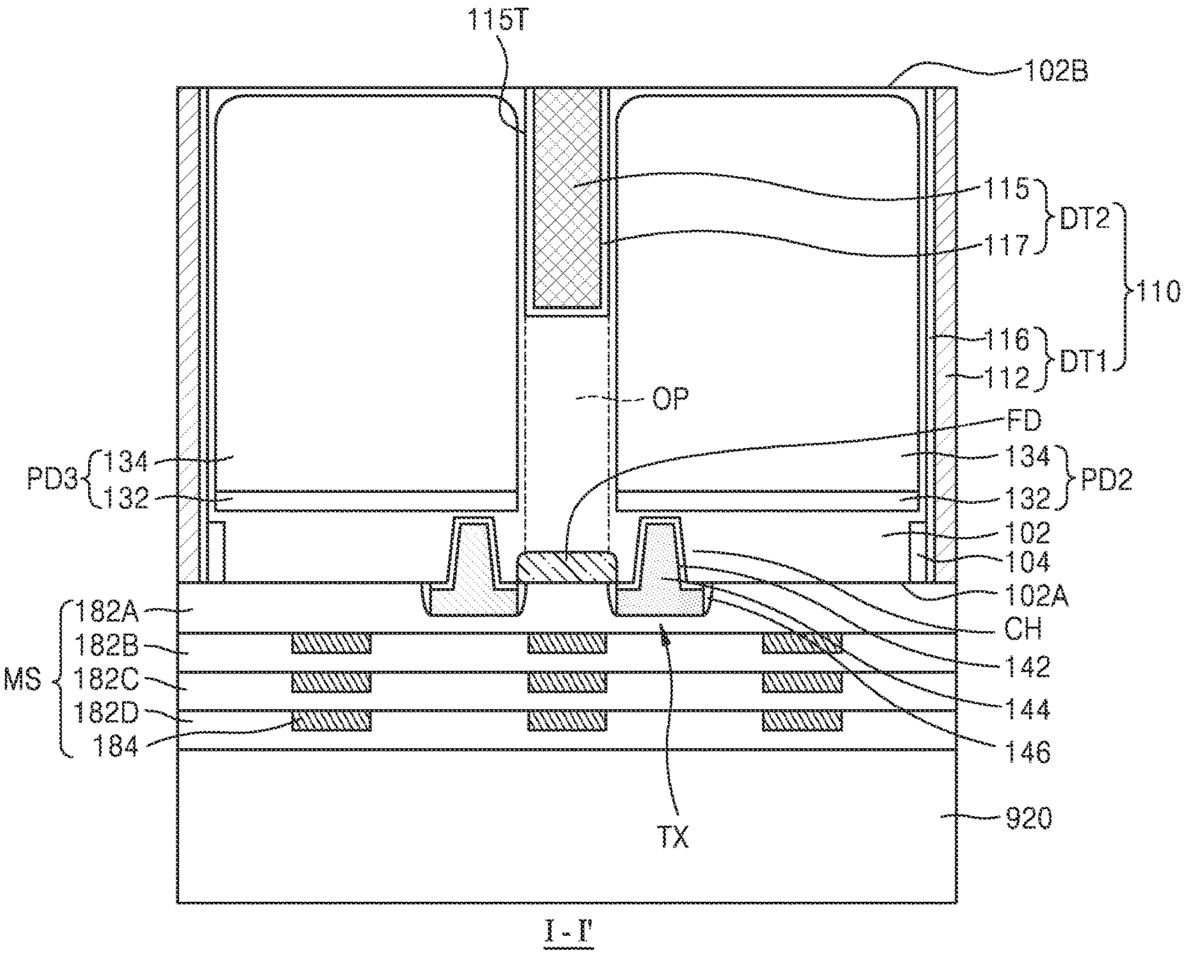

Referring to FIG. 19, in the result of FIG. 18, a lower separation film 115 and a second liner 117 may be formed inside the second trench 115T. A second liner 117 may be formed on the exposed surface of the second trench 115T, and a lower separation film 115 filling the inner space of the second trench 115T may be formed on the second liner 117. The lower separation film 115 and the second liner 117 may form a second separation structure DT2. A plurality of sensing areas SA (see, e.g., FIG. 3A) may be defined by the first separation structure DT1 and the second separation structure DT2.

Figure 20A:
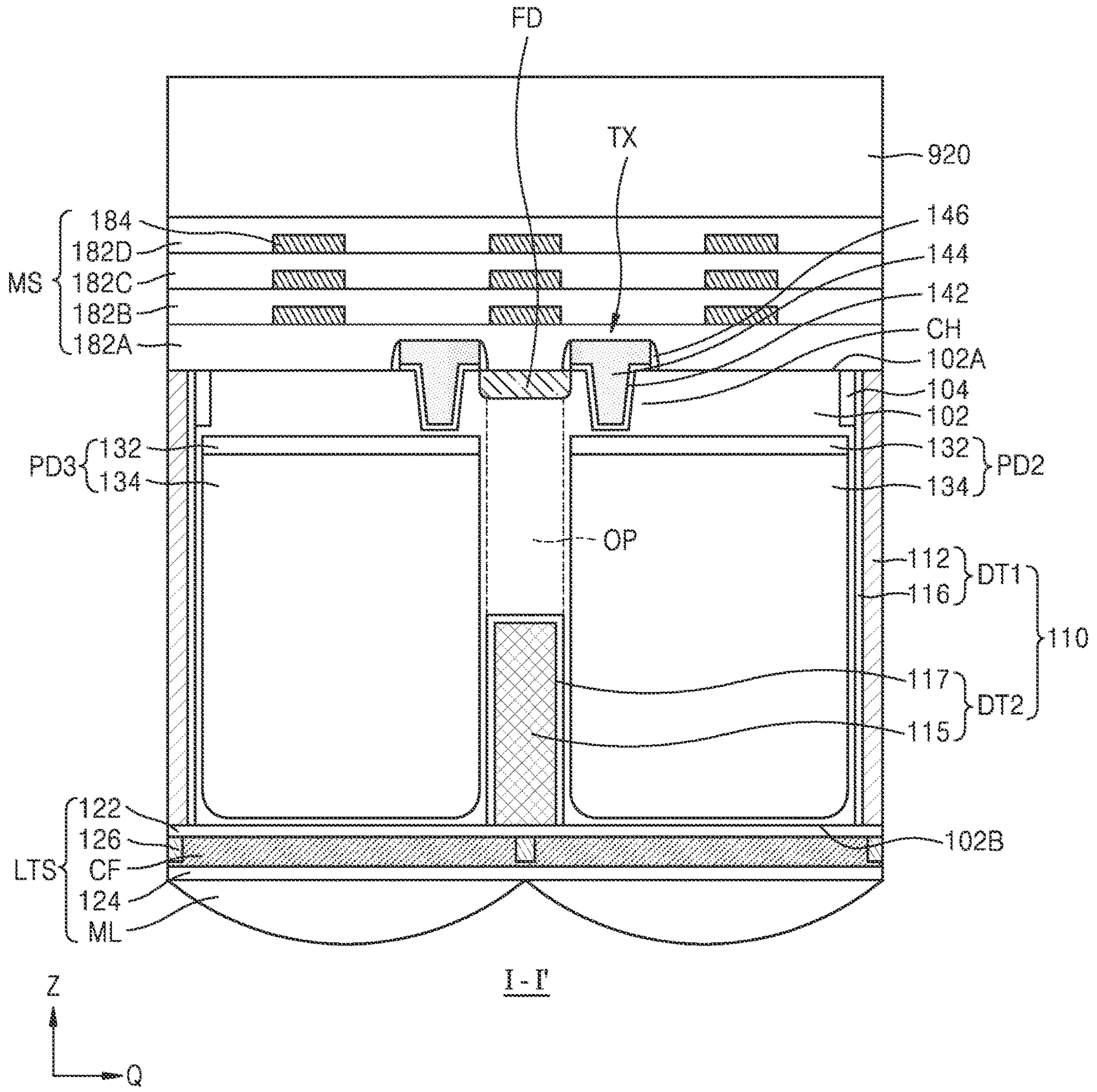
Figure 20B:
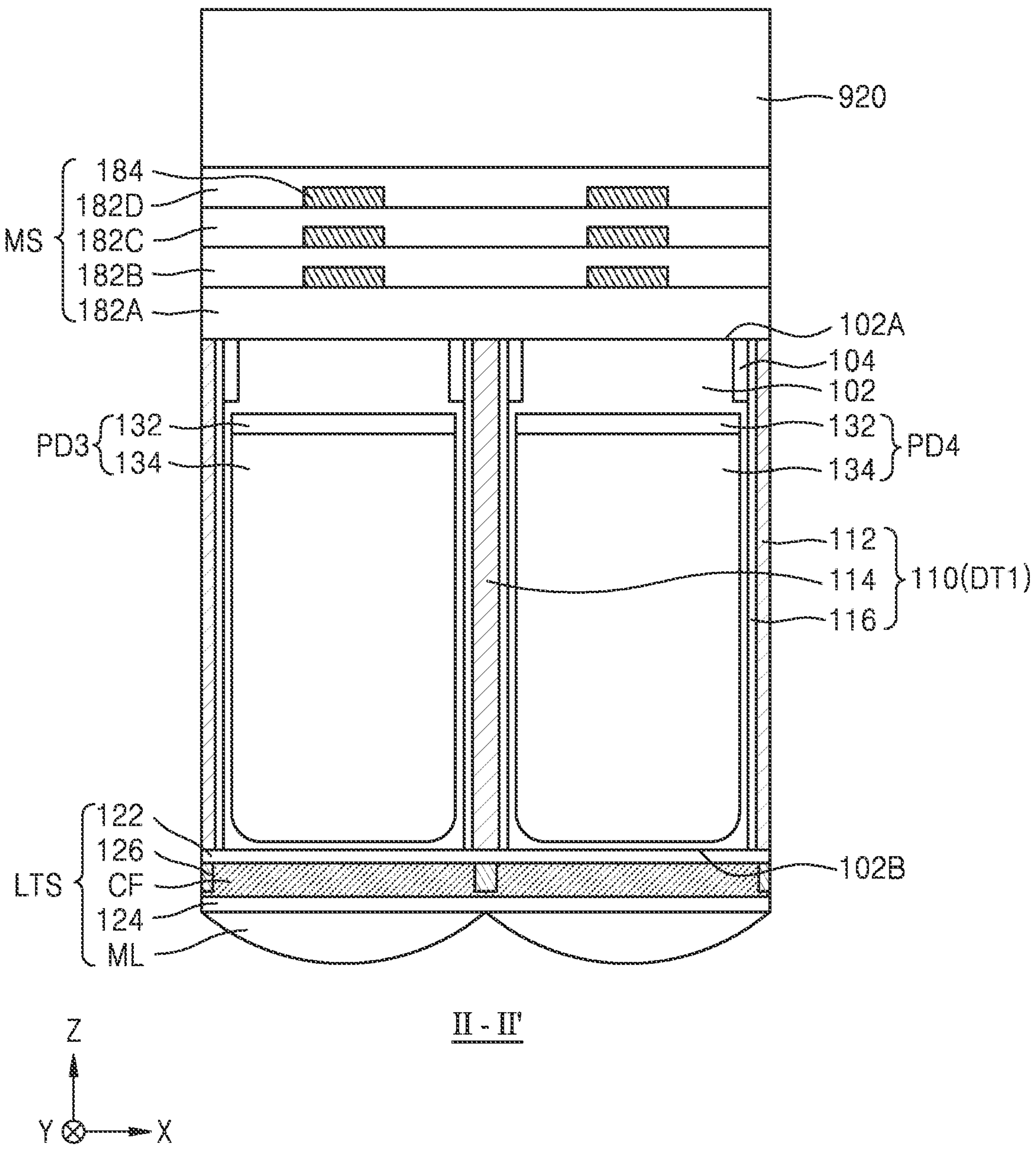

Referring to FIGS. 20A and 20B, in the result of FIG. 19, the first surface 102A and the second surface 102B of the substrate 102 may be reversed. Thereafter, a first planarization film 122, an anti-reflection film 126, a color filter CF, a second planarization film 124, and a micro lens ML are sequentially formed on the second surface 102B of the substrate 102, the bottom surface of the outer separation film 112, the bottom surfaces of the plurality of inner separation films 114, the bottom surface of the lower separation film 115, the bottom surface of the first liner 116, and the bottom surface of the second liner 117, so that a light transmission structure LTS may be formed. Thereafter, the image sensor 100 illustrated in FIGS. 3A to 3E may be manufactured by removing the support substrate 920.

The manufacturing method of the image sensor 100 illustrated in FIGS. 3A to 3E has been described with reference to FIGS. 12A to 20B, it will be obvious to those skilled in the art will that the image sensor 200 described with reference to FIGS. 4 to 6, the image sensor 300 described with reference to FIGS. 7 to 9 and image sensors variously modified and changed from the image sensors 200 and 300 may be manufactured within the scope of the technical idea of the inventive concept by applying various modifications and changes within the scope of the technical idea of the inventive concept.

While the inventive concept has been particularly shown and described with reference to embodiments thereof, it will be understood that various changes in form and details may be made therein without departing from the spirit and scope of the following claims.

What is claimed is:

1. An image sensor, comprising:

a substrate having a first surface and a second surface opposing the first surface;

a first color unit pixel including a first subpixel, a second subpixel directly adjacent to the first subpixel in a first direction, a third subpixel directly adjacent to the second subpixel in a second direction perpendicular to the first direction, and a fourth subpixel directly adjacent to the first subpixel in the second direction and the third subpixel in the first direction;

a second color unit pixel including four subpixels arranged in a 2×2 matrix;

a first pixel isolation trench configured to separate the first color unit pixel and the second color unit pixel;

a second pixel isolation trench configured to separate the first subpixel and the second subpixel of the first color unit pixel; and a third pixel isolation trench on a point of intersection of the first to fourth subpixels of the first color unit pixel, wherein the first color unit pixel is configured to detect first color light corresponding to a first wavelength, wherein the second color unit pixel is configured to detect second color light corresponding to a second wavelength different from the first wavelength, wherein the image sensor is configured to receive the first color light on the second surface, wherein the second pixel isolation trench extends from the first surface to the second surface, and wherein the third pixel isolation trench extends from the second surface to the first surface.

2. The image sensor of claim 1, wherein the second pixel isolation trench penetrates the first surface and the second surface, and wherein the third pixel isolation trench is spaced apart from the first surface.

3. The image sensor of claim 1, wherein the first pixel isolation trench penetrates the first surface and the second surface, and wherein the first pixel isolation trench connects to the second pixel isolation trench.

4. The image sensor of claim 1, wherein the third pixel isolation trench is spaced apart from the second pixel isolation trench.

5. The image sensor of claim 1, wherein the second pixel isolation trench has a first length in the second direction, and wherein the third pixel isolation trench has a second length in the second direction shorter than the first length.

6. The image sensor of claim 1, further comprises a fourth pixel isolation trench separating the second subpixel and the third subpixel of the first color unit pixel, and wherein the fourth pixel isolation trench is connected to the first pixel isolation trench.

7. The image sensor of claim 1, further comprises a floating diffusion region on the first surface, and wherein the floating diffusion region vertically overlaps with the third pixel isolation trench.

8. The image sensor of claim 1, wherein the third pixel isolation trench includes silicon oxide and metal oxide.

9. The image sensor of claim 1, wherein the first pixel isolation trench includes silicon oxide and metal oxide.

10. The image sensor of claim 1, wherein the third pixel isolation trench has a first part having a third length in the first direction and a second part having a fourth length in the first direction greater than the third length, and wherein the first part is closer to the second pixel isolation trench than the second part in the second direction.

11. An image sensor, comprising:

a substrate having a first surface and a second surface opposing the first surface;

a first color unit pixel including a plurality of subpixels arranged in a 2×2 matrix in the substrate;

a second color unit pixel including a plurality of subpixels arranged in a 2×2 matrix in the substrate, wherein the second color unit pixel is disposed directly adjacent to the first color unit pixel; and a first pixel isolation trench comprising:

a first separation structure around the first color unit pixel;

a left separation structure extending from a left boundary of the first color unit pixel to a center of the first color unit pixel;

a right separation structure extending from a right boundary opposing the left boundary of the first color unit pixel to the center of the first color unit pixel;

a top separation structure extending from a top boundary of the first color unit pixel to the center of the first color unit pixel; and a bottom separation structure extending from a bottom boundary opposing the top boundary of the first color unit pixel to the center of the first color unit pixel, wherein the first color unit pixel is configured to detect first color light corresponding to a first wavelength, wherein the second color unit pixel is configured to detect second color light corresponding to a second wavelength different from the first wavelength, wherein the left, right, top, and bottom separation structures are connected to the first separation structure, wherein the first, left, right, top, and bottom separation structures are configured to penetrate the substrate, wherein the left separation structure is spaced apart from the right separation structure, wherein the top separation structure is spaced apart from the bottom separation structure, wherein the image sensor further comprises a second pixel isolation trench within the first color unit pixel, wherein the second pixel isolation trench is spaced apart from the first pixel isolation trench, and wherein the second pixel isolation trench does not penetrate the substrate.

12. The image sensor of claim 11, wherein the first color unit pixel has a horizontal unit pixel length in a first direction, and wherein a length from the center of the first color unit pixel to an end of the left separation structure is shorter than ¼ of the horizontal unit pixel length.

13. The image sensor of claim 11, wherein the first color unit pixel has a vertical unit pixel length in a second direction perpendicular to the first direction, and wherein a length from the center of the first color unit pixel to an end of the top separation structure is shorter than ¼ of the vertical unit pixel length.

14. The image sensor of claim 11, wherein the first color unit pixel has a horizontal unit pixel length in a first direction, and wherein the length from the center of the first color unit pixel to an end of the left separation structure is shorter than ⅙ of the horizontal unit pixel length.

15. The image sensor of claim 11, wherein the second pixel isolation trench is on the center of the plurality of subpixels arranged in a 2×2 matrix.

16. The image sensor of claim 11, wherein the second pixel isolation trench extends from the second surface to the first surface.

17. The image sensor of claim 11, wherein the first pixel isolation trench extends from the first surface to the second surface.

18. The image sensor of claim 11, further comprises a floating diffusion region on the first surface, and wherein the floating diffusion region vertically overlaps with the second pixel isolation trench.

19. An image sensor, comprising:

a substrate having a first surface and a second surface opposing the first surface;

a plurality of interlayer insulating films and a plurality of wiring layers disposed on the first surface of the substrate;

a color filter and a micro lens disposed on the second surface of the substrate;

a first color unit pixel including a first subpixel, a second subpixel directly adjacent to the first subpixel in a first direction, a third subpixel directly adjacent to the second subpixel in a second direction perpendicular to the first direction, and a fourth subpixel directly adjacent to the first subpixel in the second direction and the third subpixel in the first direction;

a second color unit pixel including four subpixels arranged in a 2×2 matrix;

a first pixel isolation trench configured to separate the first color unit pixel and the second color unit pixel;

a second pixel isolation trench configured to separate the first subpixel and the second subpixel of the first color unit pixel; and a third pixel isolation trench on a point of intersection of the first to fourth subpixels of the first color unit pixel, wherein the first color unit pixel is configured to detect first color light corresponding to a first wavelength, wherein the second color unit pixel is configured to detect second color light corresponding to a second wavelength different from the first wavelength, wherein the image sensor is configured to receive the first color light on the second surface, wherein the second pixel isolation trench extends from the first surface to the second surface, and wherein the third pixel isolation trench extends from the second surface to the first surface.

* * * * *